(12) United States Patent
Karlov

(10) Patent No.: US 8,600,180 B2
(45) Date of Patent: Dec. 3, 2013

(54) COMPRESSION METHOD SELECTION FOR DIGITAL IMAGES

(75) Inventor: David Karlov, Emu Plains (AU)

(73) Assignee: Canon Kabushiki Kaisha, Tokyo (JP)

( * ) Notice: Subject to any disclaimer, the term of this patent is extended or adjusted under 35 U.S.C. 154(b) by 253 days.

(21) Appl. No.: 12/911,364

(22) Filed: Oct. 25, 2010

(65) Prior Publication Data

US 2011/0103703 A1 May 5, 2011

(30) Foreign Application Priority Data

Oct. 30, 2009 (AU) ................................ 2009233627

(51) Int. Cl.
*G06K 9/36* (2006.01)
(52) U.S. Cl.
USPC ......................................................... 382/239
(58) Field of Classification Search
None
See application file for complete search history.

(56) References Cited

U.S. PATENT DOCUMENTS

| 5,479,587 | A | 12/1995 | Campbell et al. ............ 395/116 |
| 6,285,458 | B1 * | 9/2001 | Yada ........................... 358/1.15 |
| 6,778,291 | B1 | 8/2004 | Clouthier ..................... 358/1.16 |
| 7,020,337 | B2 * | 3/2006 | Viola et al. .................... 382/224 |
| 7,184,603 | B2 | 2/2007 | Gringeler et al. ............ 382/244 |
| 2004/0095601 | A1 | 5/2004 | Ozawa ......................... 358/1.15 |

OTHER PUBLICATIONS

Australian Examiner's First Report dated Oct. 7, 2011 in counterpart Australian Patent Application No. 2009233627.
Notice of Acceptance dated Mar. 14, 2012 in counterpart Australian Application No. 2009233627.

\* cited by examiner

*Primary Examiner* — Stephen R Koziol
*Assistant Examiner* — Amandeep Saini
(74) *Attorney, Agent, or Firm* — Fitzpatrick, Cella, Harper & Scinto

(57) ABSTRACT

Disclosed is a method of compressing an image (1301) using one of a plurality of candidate compression methods (1120, 1130), said method comprising the steps of (a) processing a portion of the image to determine, for at least some of the candidate compression methods, associated compressibility scores (220) and corresponding pairs of thresholds (230), the compressibility scores and the pairs of thresholds being dependent upon the proportion of the image that has been processed, (b) comparing (240, 260) the compressibility scores to the corresponding pairs of thresholds, (c) selecting (250), if a compressibility score satisfies the corresponding pair of thresholds, the associated candidate compression method, and (d) compressing the image (1301) using the selected candidate compression method.

12 Claims, 14 Drawing Sheets

COMPRESSION METHOD SELECTION FOR DIGITAL IMAGES

REFERENCE TO RELATED PATENT APPLICATION

This application claims the benefit under 35 U.S.C. §119 of the filing date of Australian Patent Application No. 2009233627, filed 30 Oct. 2009, hereby incorporated by reference in its entirety as if fully set forth herein.

TECHNICAL FIELD

The current invention relates to data compression and in particular to selecting between methods of compressing digital images for presentation by devices such as a page printer or a digital display.

BACKGROUND

Graphics packages are currently available for rendering images such as printed pages to printers, display screens, or for output to software files to be stored in storage devices. Some of these graphics packages utilise a high-level page description language for effecting the layout of the printed pages. These graphics packages typically comprise a rendering system, which converts the high-level page description of the page layout into pixel data that can be used as raster data to be printed or displayed.

Computer-generated images are typically made up of many different components or graphical elements which are rendered and composited together to create a final image. The rendering and compositing may be performed by special-purpose hardware, or by software running on a general or special-purpose computer system, such as a microprocessor inside a printer. For each graphical element, a software application sends a drawing command to a graphics device interface layer. The printer driver generates a final description of the page to be printed which comprises a description of each graphical element. Examples of graphical elements include text strings, paths and images. This final description is called a display list. The display list is then spooled (ie transferred) to a print engine in the target printer. The display list consists of a set of rendering instructions. The terms "Display list" and "set of rendering instructions" are used interchangeably throughout this description, unless otherwise indicated.

The display list is typically stored in memory while it is processed by the computer system. Some rendering instructions, particularly instructions containing an image, have high memory requirements. To reduce the amount of memory needed in the system, and hence reduce the cost of hardware in the system, it is desirable to reduce the size of these instructions by applying compression to the image data contained therein. Various image compression methods are available, including lossless and lossy methods. The best compression method to use in any particular case depends on the image content. Image content can typically be categorized broadly into two categories, namely "graphics" and "natural images".

Graphics are typically computer-generated images with sharp edges and a limited number of colours. Examples of images in the graphics category are informational graphs, text, diagrams, and line-art. Graphics usually contain blocks of solid colour.

Natural images are images that are typically sourced from the "real world". These include images captured using a digital camera or scanner. Natural images typically contain a larger number of colours and more gradual colour variations than graphics.

Both graphics and natural images contain redundant information when described in a raw pixel-based format, which makes each type of image suitable for compression to some extent. However, not all compression methods are suitable for each type of image. Selecting an unsuitable compression method for an image can lead to an unacceptable amount of image quality degradation and a poor compression ratio (in some cases leading to a compressed size larger than the original image size). It is therefore desirable to select a suitable compression method.

Some methods for selecting a suitable compression method divide an image into strips or blocks and analyse the image data in each strip or block independently. This analysis can then be used to select a suitable compression method to use for individual strips or blocks, or a compression method to use for the entire image. These solutions typically make a trade-off between the effectiveness of the final decision and the proportion of image data that is analysed. This means choosing between achieving an optimal compressed size for the image and an acceptably brief execution time for analysis.

SUMMARY

It is an object of the present invention to substantially overcome, or at least ameliorate, one or more disadvantages of existing arrangements.

Disclosed are arrangements, referred to as Threshold Based Compression Selection (or TBCS) arrangements, which seek to address the above problems by selecting a compression method from a number of candidates by comparing estimated compression performance of the candidates against candidate specific performance thresholds derived from the image in question, the estimated compression performance and the thresholds having greater levels of confidence as more of the image is processed, and selecting a candidate as soon as a desired level of confidence in the selection is reached.

According to a first aspect of the present invention, there is provided a computer implemented method of compressing an image using one of a plurality of compression methods, said method comprising the steps of:

analysing a first portion of the image to determine a compressibility score;

comparing the compressibility score to a plurality of threshold values, each of the plurality of threshold values associated with a corresponding compression method from the plurality of compression methods, wherein each of the plurality of threshold values is dependent upon an amount of the first analysed portion of the image;

if the compressibility score satisfies a first one of the plurality of threshold value, selecting a compression method associated with said threshold value to compress the image and if the compressibility score satisfies a second one of the plurality of threshold value, rejecting the compression method associated with said threshold value.

According to another aspect of the present invention, there is provided a computer implemented method of compressing an image, said method comprising the steps of:

analysing a portion of the image to determine a compressibility score;

determining an acceptance threshold and a rejection threshold according to an amount of the analysed portion of the image;

comparing said compressibility score with said acceptance threshold and with said rejection threshold;

if said compressibility score satisfies said acceptance threshold, selecting a first compression method for compressing the image; and if said compressibility score satisfies said rejection threshold, selecting a second compression method for compressing the image.

According to another aspect of the present invention, there is provided an apparatus for implementing any one of the aforementioned methods.

According to another aspect of the present invention, there is provided a computer program product including a computer readable medium having recorded thereon a computer program for implementing any one of the aforementioned methods.

Other aspects of the invention are also disclosed.

BRIEF DESCRIPTION OF THE DRAWINGS

One or more TBCS arrangements will now be described with reference to the following drawings, in which.

DETAILED DESCRIPTION INCLUDING BEST MODE

Figure 1A:
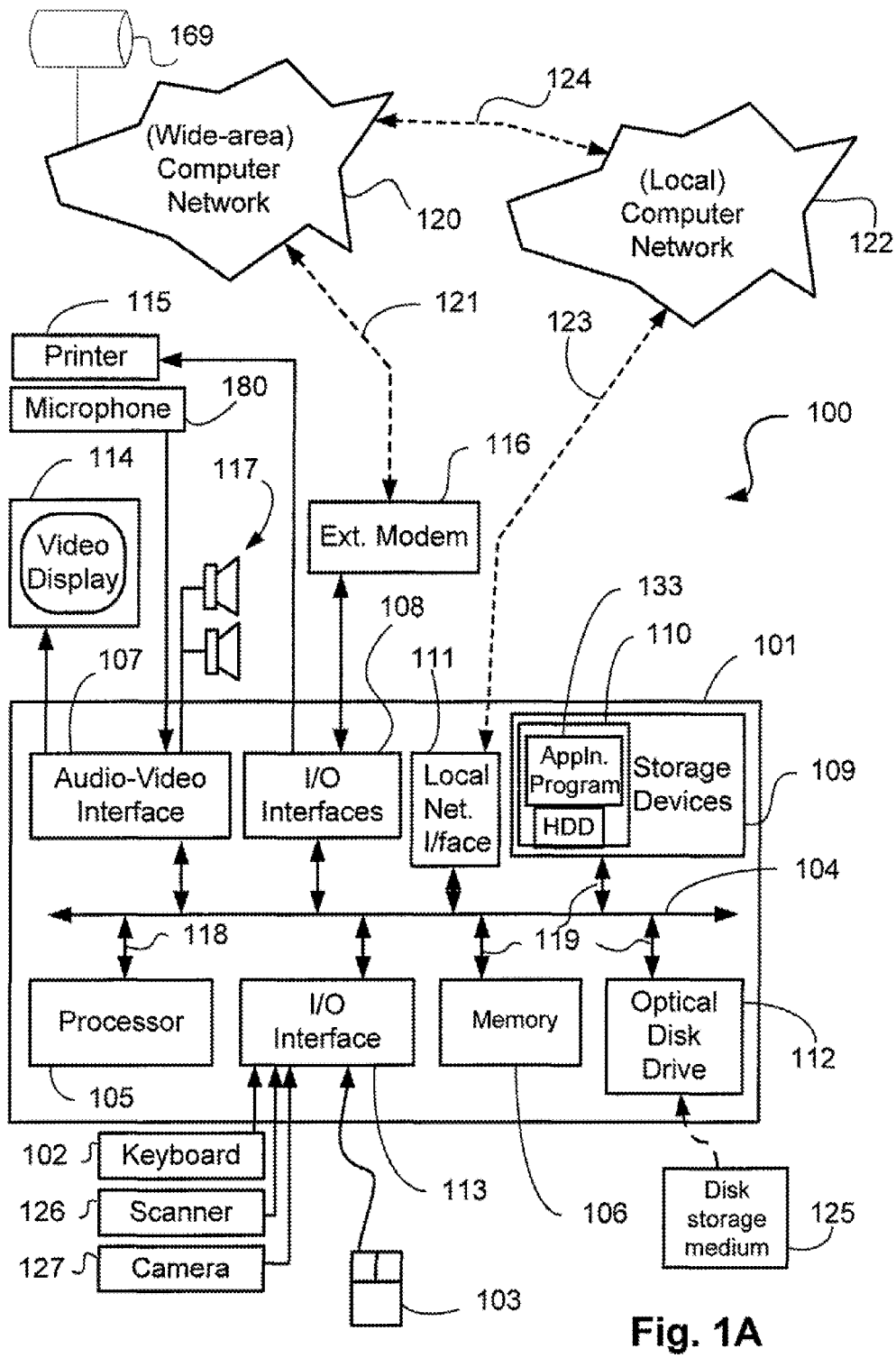
FIGS. 1A and 1B collectively form a schematic block diagram of a general purpose computing system in which the TBCS arrangements to be described may be implemented.

It is to be noted that the discussions contained in the "Background" section and that above relating to prior art arrangements relate to devices which form public knowledge through their use. Such discussions should not be interpreted as a representation by the present inventor(s) or the patent applicant that such devices in any way form part of the common general knowledge in the art.

Where reference is made in any one or more of the accompanying drawings to steps and/or features, which have the same reference numerals, those steps and/or features have for the purposes of this description the same function(s) or operation(s), unless the contrary intention appears.

Figure 12:
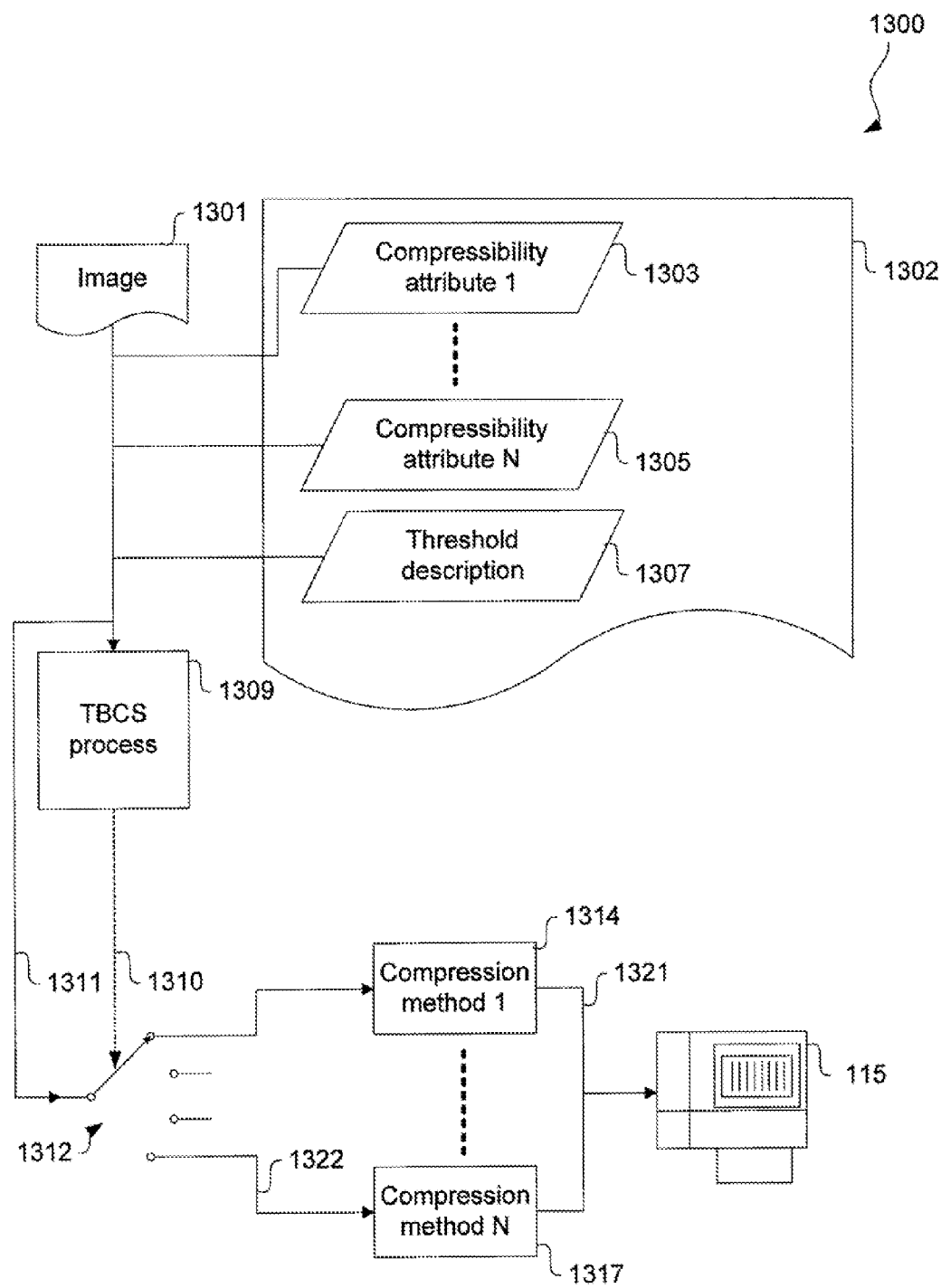
FIG. 12 is a functional block diagram of a TBCS arrangement in which the TBCS method is implemented in a free standing computer which transfers a suitably compressed image to a printer for printing.

FIG. 12 is a functional block diagram of a TBCS arrangement 1300 in which the TBCS method is implemented as a part of a software application 133 executing on a free standing computer 101 (see FIG. 1A) which transfers a suitably compressed image to a printer 115 for printing.

FIG. 12 shows an image 1301 which is to be printed on the printer 115 after the image has been compressed by a suitable compression method (also referred to as a compression engine) that is selected from a set of available compression methods 1314, ..., 1317 using the TBCS process. The image 1301 may for example be produced by scanning a printed document (not shown) using a scanner 126. Alternately, the image 1301 may be downloaded from a remote repository 169 over a network 120 (refer to FIGS. 1A and 1B and the associated description). The image 1301 may also form part of a larger document comprising different graphic elements such as text strings and paths.

The image 1301 is processed by a TBCS process 1309 in order to select a suitable compression method from the set of available compression methods 1314, ..., 1317. The TBCS process 1309 performs the aforementioned selection based upon (a) the image 1301, and information 1302 that describes (b) a set of compressibility attributes 1303, ..., 1305 which are associated with the corresponding compression methods 1314, ..., 1317, and (c) a description 1307 of how one or more thresholds are to be defined. If a larger document contains more than one image, a set of compressibility attributes 1303, ..., 1305 is calculated for each of the images. While each compression method may have an associated compressibility attribute, this is not necessary. Furthermore, while each compression method may have an associated threshold description 1307, this is not necessary.

The compressibility attributes 1303, ..., 1305 define compression engine specific methods for estimating, in regard to the image in question 1301, the compression ratio achievable by the compression engine in question. These estimates are also referred to as compressibility scores.

The threshold description 1307 defines, in regard to the image in question 1301, one or more thresholds which set bounds with which the compressibility scores must comply in order for the compression engine in question to be selected. It should be noted that these bounds are not fixed threshold values; rather they describe threshold values that vary with respect to the amount of the image 1301 that has been analysed.

The TBCS process 1309 thus processes the image 1301 or parts thereof having regard to the compressibility attributes 1303, ..., 1305 and the threshold description 1307, and thereby selects a suitable compression method from the set of compression methods 1314, ..., 1317. In one implementation the TBCS process 1309 sends a control signal 1310 to a switch 1312 in order to direct, as depicted by an arrow 1311, the image 1301 via the switch 1312 to the selected compression method. Thus for example if compression method no. 1 (ie 1314) is selected, then the image 1301 is directed via the switch 1312, as depicted by the arrow 1311, to the compression method 1314. The compressed image is then directed, as depicted by an arrow 1321, to the printer 115 for printing.

Although the TBCS arrangement in FIG. 12 shows the TBCS process being effected in the free standing computer 101 which sends the compressed image to the printer 115, the TBCS arrangement may also be implemented in the printer 115 itself or elsewhere in a networked system. The TBCS arrangement may also be implemented using other arrangements of functional modules.

Figure 1B:
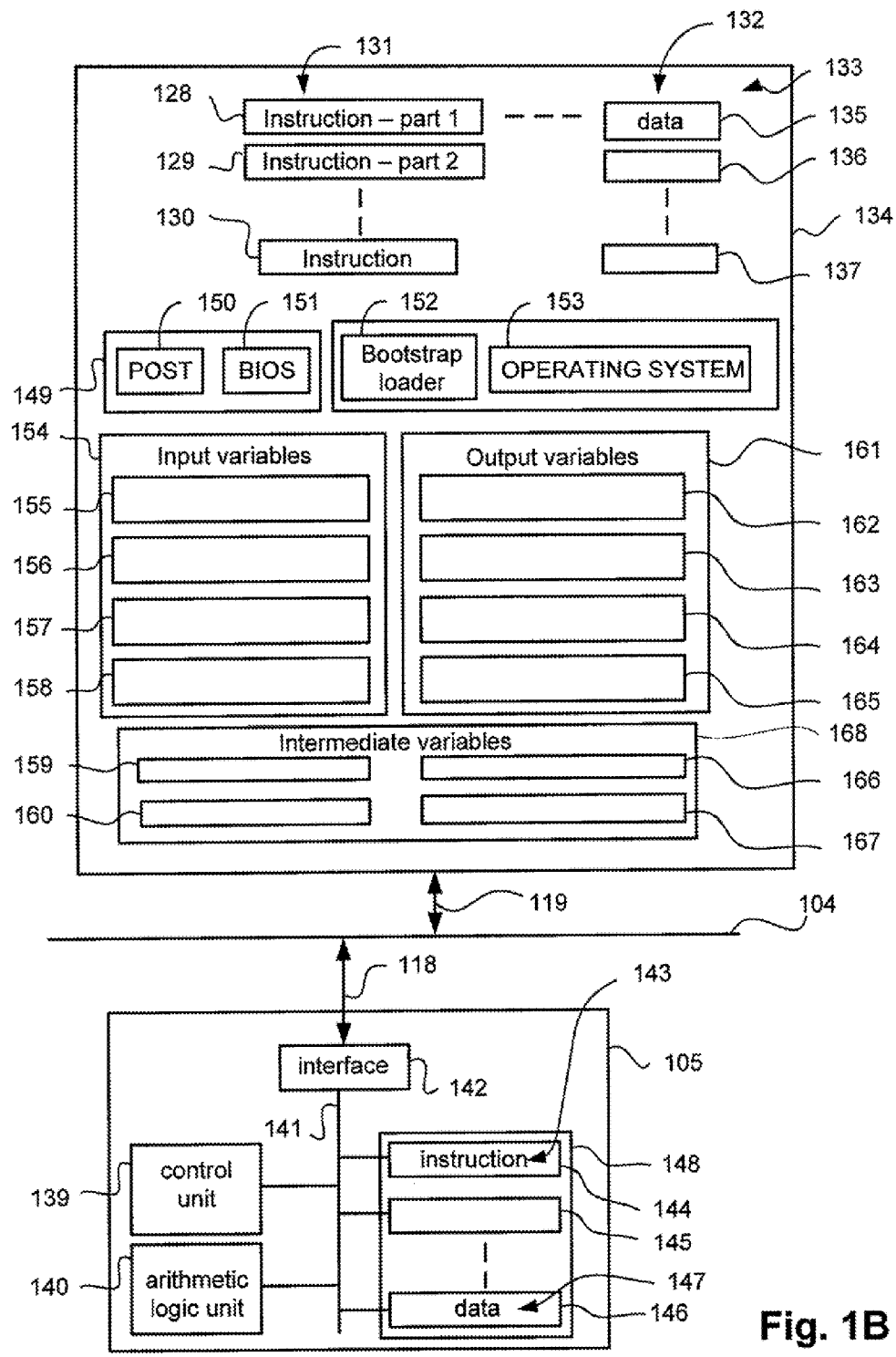

FIGS. 1A and 1B collectively form a schematic block diagram of a general purpose computer system apparatus 100, upon which the various TBCS arrangements described may be practiced.

As seen in FIG. 1A, the computer system 100 is formed by a computer module 101, input devices such as a keyboard 102, a mouse pointer device 103, a scanner 126, a camera 127, and a microphone 180, and output devices including the printer 115, a display device 114 and loudspeakers 117. An external Modulator-Demodulator (Modem) transceiver device 116 may be used by the computer module 101 for communicating to and from a communications network 120 via a connection 121. The network 120 may be a wide-area network (WAN), such as the Internet or a private WAN. Where the connection 121 is a telephone line, the modem 116 may be a traditional "dial-up" modem. Alternatively, where the connection 121 is a high capacity (eg: cable) connection, the modem 116 may be a broadband modem. A wireless modem may also be used for wireless connection to the network 120.

The computer module 101 typically includes at least one processor unit 105, and a memory unit 106 for example formed from semiconductor random access memory (RAM) and semiconductor read only memory (ROM). The module 101 also includes an number of input/output (I/O) interfaces including an audio-video interface 107 that couples to the video display 114, loudspeakers 117 and microphone 180, an I/O interface 113 for the keyboard 102, mouse 103, scanner 126, camera 127 and optionally a joystick (not illustrated), and an interface 108 for the external modem 116 and printer 115. In some implementations, the modem 116 may be incorporated within the computer module 101, for example within the interface 108. The computer module 101 also has a local network interface 111 which, via a connection 123, permits coupling of the computer system 100 to a local computer network 122, known as a Local Area Network (LAN). As also illustrated, the local network 122 may also couple to the wide network 120 via a connection 124, which would typically include a so-called "firewall" device or device of similar functionality. The interface 111 may be formed by an Ethernet™ circuit card, a Bluetooth™ wireless arrangement or an IEEE 802.11 wireless arrangement.

The interfaces 108 and 113 may afford either or both of serial and parallel connectivity, the former typically being implemented according to the Universal Serial Bus (USB) standards and having corresponding USB connectors (not illustrated). Storage devices 109 are provided and typically include a hard disk drive (HDD) 110. Other storage devices such as a floppy disk drive and a magnetic tape drive (not illustrated) may also be used. An optical disk drive 112 is typically provided to act as a non-volatile source of data. Portable memory devices, such optical disks (eg: CD-ROM, DVD), USB-RAM, and floppy disks for example may then be used as appropriate sources of data to the system 100.

The components 105 to 113 of the computer module 101 typically communicate via an interconnected bus 104 and in a manner which results in a conventional mode of operation of the computer system 100 known to those in the relevant art. Examples of computers on which the described arrangements may be practised include IBM-PC's and compatibles, Sun Sparcstations, Apple Mac™ or alike computer systems evolved therefrom.

The TBCS method may be implemented using the computer system 100 wherein the processes of FIGS. 2, 4, 5 and 8-10, to be described, may be implemented as one or more software application programs 133 executable within the computer system 100. In particular, the steps of the TBCS method of compression method selection are effected by instructions 131 in the software 133 that are carried out within the computer system 100. The software instructions 131 may be formed as one or more code modules, each for performing one or more particular tasks. The software may also be divided into two separate parts, in which a first part and the corresponding code modules performs the TBCS compression method selection and a second part and the corresponding code modules manage a user interface between the first part and the user.

The software 133 is generally loaded into the computer system 100 from a computer readable medium, and is then typically stored in the HDD 110, as illustrated in FIG. 1A, or the memory 106, after which the software 133 can be executed by the computer system 100. In some instances, the TBCS application programs 133 may be supplied to the user encoded on one or more CD-ROM 125 and read via the corresponding drive 112 prior to storage in the memory 110 or 106. Alternatively the TBCS software 133 may be read by the computer system 100 from the networks 120 or 122 or loaded into the computer system 100 from other computer readable media. Computer readable storage media refers to any non-transitory tangible storage medium that participates in providing instructions and/or data to the computer system 100 for execution and/or processing. Examples of such storage media include floppy disks, magnetic tape, CD-ROM, a hard disk drive, a ROM or integrated circuit, USB memory, a magneto-optical disk, or a computer readable card such as a PCMCIA card and the like, whether or not such devices are internal or external of the computer module 101. Examples of computer readable transmission media that may also participate in the provision of software, application programs, instructions and/or data to the computer module 101 include radio or infra-red transmission channels as well as a network connection to another computer or networked device, and the Internet or Intranets including e-mail transmissions and information recorded on Websites and the like.

The second part of the TBCS application programs 133 and the corresponding code modules mentioned above may be executed to implement one or more graphical user interfaces (GUIs) to be rendered or otherwise represented upon the display 114, for example. Through manipulation of typically the keyboard 102 and the mouse 103, a user of the computer system 100 and the TBCS application may manipulate the interface in a functionally adaptable manner to provide controlling commands and/or input to the applications associated with the GUI(s). Other forms of functionally adaptable user interfaces may also be implemented, such as an audio interface utilizing speech prompts output via the loudspeakers 117 and user voice commands input via the microphone 180.

FIG. 1B is a detailed schematic block diagram of the processor 105 and a "memory" 134. The memory 134 represents a logical aggregation of all the memory devices (including the HDD 110 and semiconductor memory 106) that can be accessed by the computer module 101 in FIG. 1A.

When the computer module 101 is initially powered up, a power-on self-test (POST) program 150 executes. The POST program 150 is typically stored in a ROM 149 of the semiconductor memory 106. A program permanently stored in a hardware device such as the ROM 149 is sometimes referred to as firmware. The POST program 150 examines hardware within the computer module 101 to ensure proper functioning, and typically checks the processor 105, the memory (109, 106), and a basic input-output systems software (BIOS) module 151, also typically stored in the ROM 149, for correct operation. Once the POST program 150 has run successfully, the BIOS 151 activates the hard disk drive 110. Activation of the hard disk drive 110 causes a bootstrap loader program 152 that is resident on the hard disk drive 110 to execute via the processor 105. This loads an operating system 153 into the RAM memory 106 upon which the operating system 153 commences operation. The operating system 153 is a system level application, executable by the processor 105, to fulfil various high level functions, including processor management, memory management, device management, storage management, software application interface, and generic user interface.

The operating system 153 manages the memory (109, 106) in order to ensure that each process or application running on the computer module 101 has sufficient memory in which to execute without colliding with memory allocated to another process. Furthermore, the different types of memory available in the system 100 should be used properly so that each process can run effectively. Accordingly, the aggregated memory 134 is not intended to illustrate how particular segments of memory are allocated (unless otherwise stated), but rather to provide a general view of the memory accessible by the computer system 100 and how such is used.

The processor 105 includes a number of functional modules including a control unit 139, an arithmetic logic unit (ALU) 140, and a local or internal memory 148, sometimes called a cache memory. The cache memory 148 typically includes a number of storage registers 144-146 in a register section. One or more internal buses 141 functionally interconnect these functional modules. The processor 105 typically also has one or more interfaces 142 for communicating with external devices via the system bus 104, using a connection 118.

The TBCS application program 133 includes a sequence of instructions 131 that may include conditional branch and loop instructions. The program 133 may also include data 132 which is used in execution of the program 133. The instructions 131 and the data 132 are stored in memory locations 128-130 and 135-137 respectively. Depending upon the relative size of the instructions 131 and the memory locations 128-130, a particular instruction may be stored in a single memory location as depicted by the instruction shown in the memory location 130. Alternately, an instruction may be segmented into a number of parts each of which is stored in a separate memory location, as depicted by the instruction segments shown in the memory locations 128-129.

In general, the processor 105 is given a set of instructions which are executed therein. The processor 105 then waits for a subsequent input, to which it reacts to by executing another set of instructions. Each input may be provided from one or more of a number of sources, including data generated by one or more of the input devices 102, 103, data received from an external source across one of the networks 120, 122, data retrieved from one of the storage devices 106, 109 or data retrieved from a storage medium 125 inserted into the corresponding reader 112. The execution of a set of the instructions may in some cases result in output of data. Execution may also involve storing data or variables to the memory 134.

The disclosed TBCS compression method selection arrangements may use input variables 154 (including 1301 and 1302 in FIG. 12 for example), that are stored in the memory 134 in corresponding memory locations 155-158. Examples of input variables 154 that may be used in the disclosed TBCS arrangements include:
input image 1301;
target compression ratio;
compressibility attributes 1303, . . . , 1305;
threshold description 1307;
definition of image subsets for the step 210; and
order in which image subsets are to be processed in the step 210.

The TBCS compression method selection arrangements produce output variables 161 (such as 1310 in FIG. 12 for example), that are stored in the memory 134 in corresponding memory locations 162-165. Examples of output variables 161 that may be used in the disclosed TBCS arrangements include:
pixel data 913.

Intermediate variables 168 may be stored in memory locations 159, 160, 166 and 167. Examples of intermediate variables 168 that may be used in the disclosed TBCS arrangements include:
display list elements 1301;
display lists 912;
compressed image outputs 599;
compressibility scores;
threshold pairs;
compression engine acceptance decision information;
compression engine rejection decision information;
number of image pixels that have been analysed from the image;
difference counter content (ie no colour changes in the scan line) for Packbits compression score determination;
estimated number of bits that would be output for LZW compression score determination; and
index of the prefix string in the string table.

The register section 144-146, the arithmetic logic unit (ALU) 140, and the control unit 139 of the processor 105 work together to perform sequences of micro-operations needed to perform "fetch, decode, and execute" cycles for every instruction in the instruction set making up the TBCS program 133. Each fetch, decode, and execute cycle comprises:

(a) a fetch operation, which fetches or reads an instruction 131 from a memory location 128;

(b) a decode operation in which the control unit 139 determines which instruction has been fetched; and (c) an execute operation in which the control unit 139 and/or the ALU 140 execute the instruction.

Thereafter, a further fetch, decode, and execute cycle for the next instruction may be executed. Similarly, a store cycle may be performed by which the control unit 139 stores or writes a value to a memory location 132.

Each step or sub-process in the processes of FIGS. 2, 4, 5 and 8-10 is associated with one or more segments of the TBCS program 133, and is performed by the register section 144-147, the ALU 140, and the control unit 139 in the processor 105 working together to perform the fetch, decode, and execute cycles for every instruction in the instruction set for the noted segments of the program 133.

The TBCS method may alternatively be implemented in dedicated hardware such as one or more gate arrays and/or integrated circuits performing the TBCS functions or sub functions. Such dedicated hardware may also include graphic processors, digital signal processors, or one or more microprocessors and associated memories. If gate arrays are used, the process flow charts in FIGS. 2, 4, 5 and 8-10 may be converted to Hardware Description Language (HDL) form. This HDL description may be converted to a device level netlist which is used by a Place and Route (P&R) tool to produce a file which is downloaded to the gate array to program it with the design specified in the HDL description.

Figure 8:
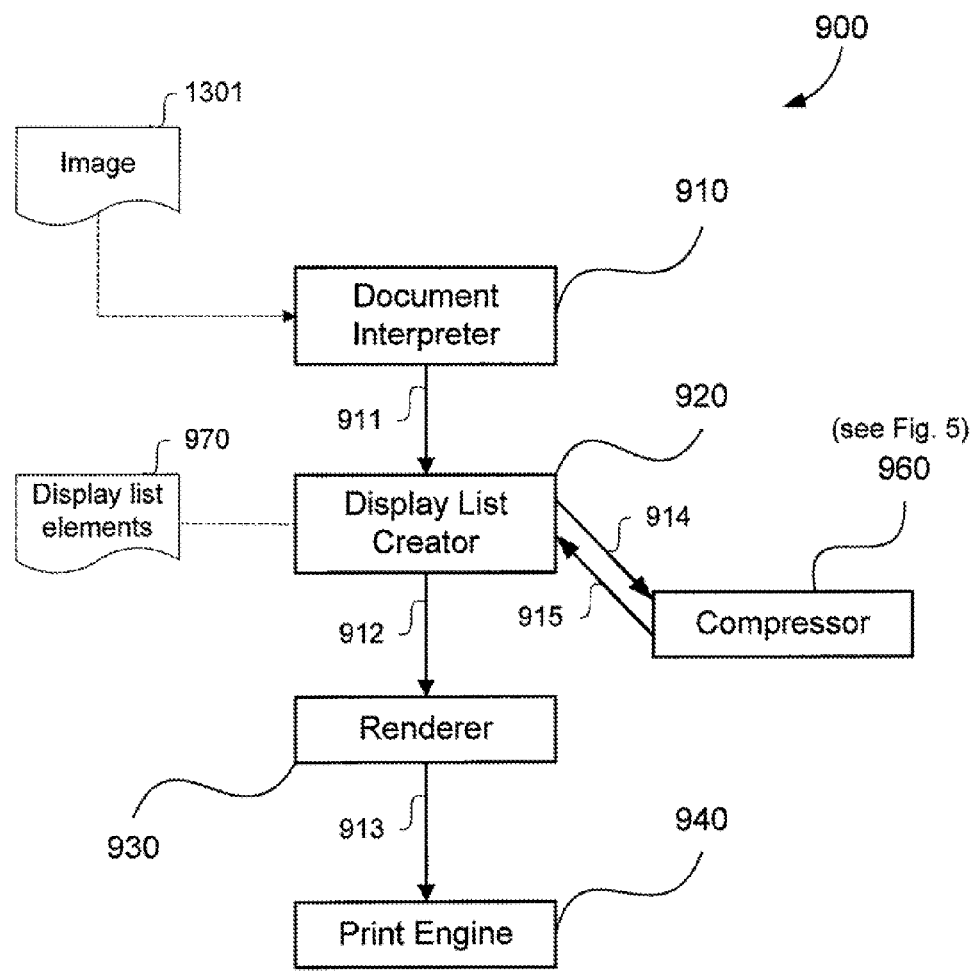
FIG. 8 is a schematic block diagram of a data-processing architecture according to a TBCS arrangement.

FIG. 8 is a functional block diagram of a data processing architecture 900 according to a TBCS arrangement. The data processing architecture 900 may be implemented as at least part of the TBCS application program 133 referred to above and may be invoked when a printing function is selected by another application (not shown) executing on the computer system 100. That other application may be any source of printable data comprising an image 1301 such as a word processing application, a browser, a graphics drawing package, and so forth.

The data processing architecture 900 operates on a page description of the page comprising an image 1301 that is to be printed. In this regard, the data processing architecture 900 may execute within the computer module 101 to interpret and render the page description of the image 1301 for outputting bitmap colour channel data, as depicted by the arrow 1321 in FIG. 12, for example, for reproduction on the printer 115. Alternatively the data processing architecture 900 may execute within the printer 115 which receives a page description from the computer module 101 and in this TBCS arrangement the printer 115 performs the document interpreting and rendering as part of the reproduction process.

In this data processing architecture 900 the document comprising the image 1301 that is submitted for printing is received from the computer module 101 and interpreted by a document interpreter 910. The document interpreter 910 generates drawing commands which are sent, as depicted by an arrow 911 to a display list creator 920. The display list creator 920 translates the drawing commands into display list elements 970. When a display list for a single page is completed, it is sent, as depicted by an arrow 912 to a renderer 930 for rendering. The Display List is in a format that can be easily processed by the renderer 930. The renderer 930 processes the Display List and generates pixel data which is sent, as depicted by an arrow 913 to a print engine 940 in the printer 115 for printing on hard copy. The document interpreter 910, the display list creator 920 and the renderer 930 may implemented as software modules in the software application 133 executing on the computer module 101, or as a separate purpose-designed hardware (or hybrid hardware/software) module executing on the printer 115.

The Display List Creator 920 stores display list elements in the memory 106 as the display list is built. When the display list is completed, the display list is sent, as depicted by the arrow 912, to the renderer 930. The renderer 930 reads the display list elements from the memory 106. In order to fit more display list elements in the available memory 106, it is desirable to reduce the size of individual display list elements if possible. Some display list elements contain image data that is required for rendering. To reduce the size of these display list elements, the image data is compressed. The display list creator 920 uses a compressor module 960 to perform compression on the image data. The compressor 960 represents the set of available compression methods 1314, . . . , 1317 depicted in FIG. 12.

Figure 5:
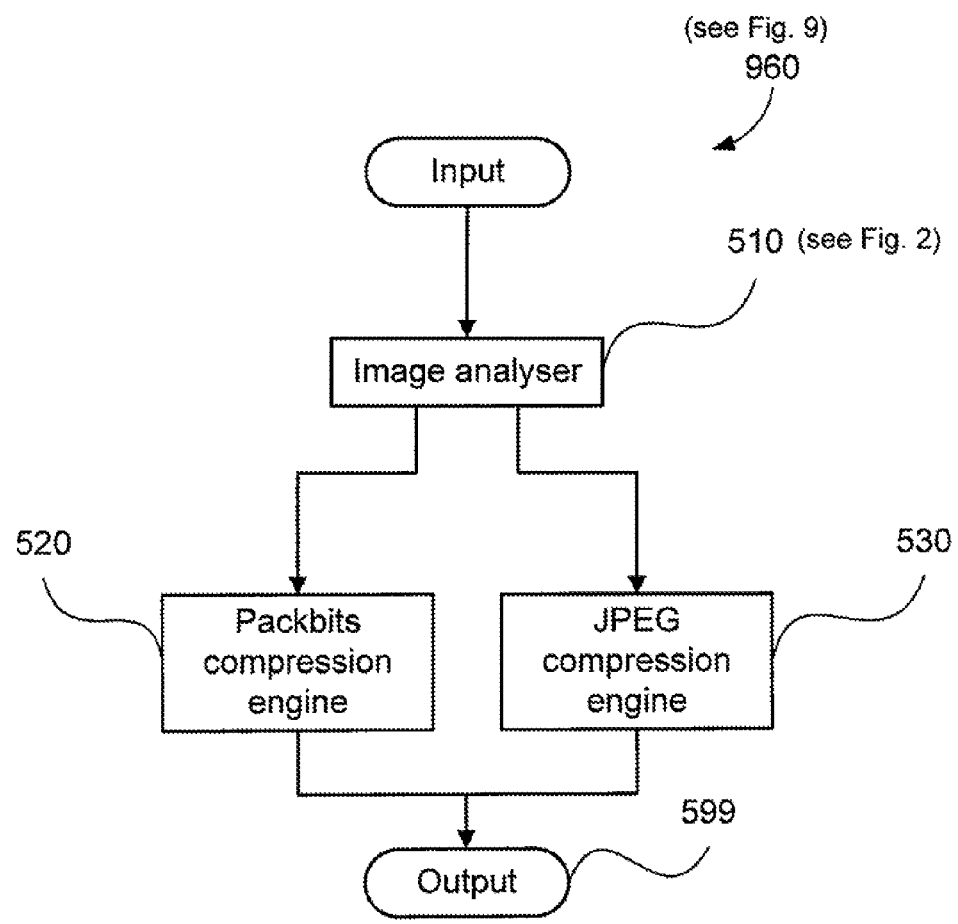
FIG. 5 is a functional block diagram of the compressor module 960 used by the display list creator 920 in FIG. 8.

FIG. 5 is a functional block diagram of the compressor module 960 used by the display list creator 920 in FIG. 8. The compressor module 960 contains an image analyser 510 and one or more compression engines (also referred to as compression methods such as 1314, . . . , 1317 in FIG. 12). These functional blocks may be implemented in hardware or software or a mixture of both hardware and software. Accordingly, reference numerals such as 510 are used to refer either to the image analyser 510 in FIG. 5 or to the corresponding image analyser process 510 in FIG. 2. A similar approach has been adopted where convenient for other functional blocks referred to in this description. In TBCS arrangement depicted in FIG. 5, the compressor module 960 contains two compression engines, namely a Packbits compression engine 520 and a JPEG compression engine 530. In practice the image analyser may contain more than two compression engines.

The Packbits compression engine 520, (introduced by Apple© with the release of MacPaint© on the Macintosh© computer) implements the Packbits compression algorithm. This is a lossless compression method for run-length encoding of data. This compression method is suited to images falling into the "graphics" category and relies on the fact that the image contains runs of pixels having the same colour value.

The JPEG compression engine 530, (which is based upon the image coding standard developed by the Joint Photographic Experts Group) implements the JPEG compression algorithm. This is a lossy compression method that is suited to images falling into the "natural" image category.

During the course of creating a display list, the display list creator 920 (in FIG. 8) supplies, as depicted by an arrow 914, the input image 1301 to the compressor module 960. The image analyser 510 (depicted in FIG. 5) in the compressor module 960 analyses the content of the image 1301 in order to choose an appropriate compression engine from those available in the compressor module 960, the available compression engines being the Packbits compression engine 520 and the JPEG compression engine 530 in the present example. The image 1301 is then passed to the selected compression engine, which produces a compressed image output 599. The compressed image output 599 is then passed, as depicted by an arrow 915, to the display list creator 920, which subsequently adds the compressed image to the display list.

The goal of the image analyser 510 in FIG. 5 is to select a compression engine that achieves an acceptable compression ratio (the ratio of original size to compressed size) while maintaining acceptable image quality. A further goal is to analyse only enough image data as is necessary to be confident in the selection of a compression engine, in order to minimise the execution time of the compressor module 960.

Figure 2:
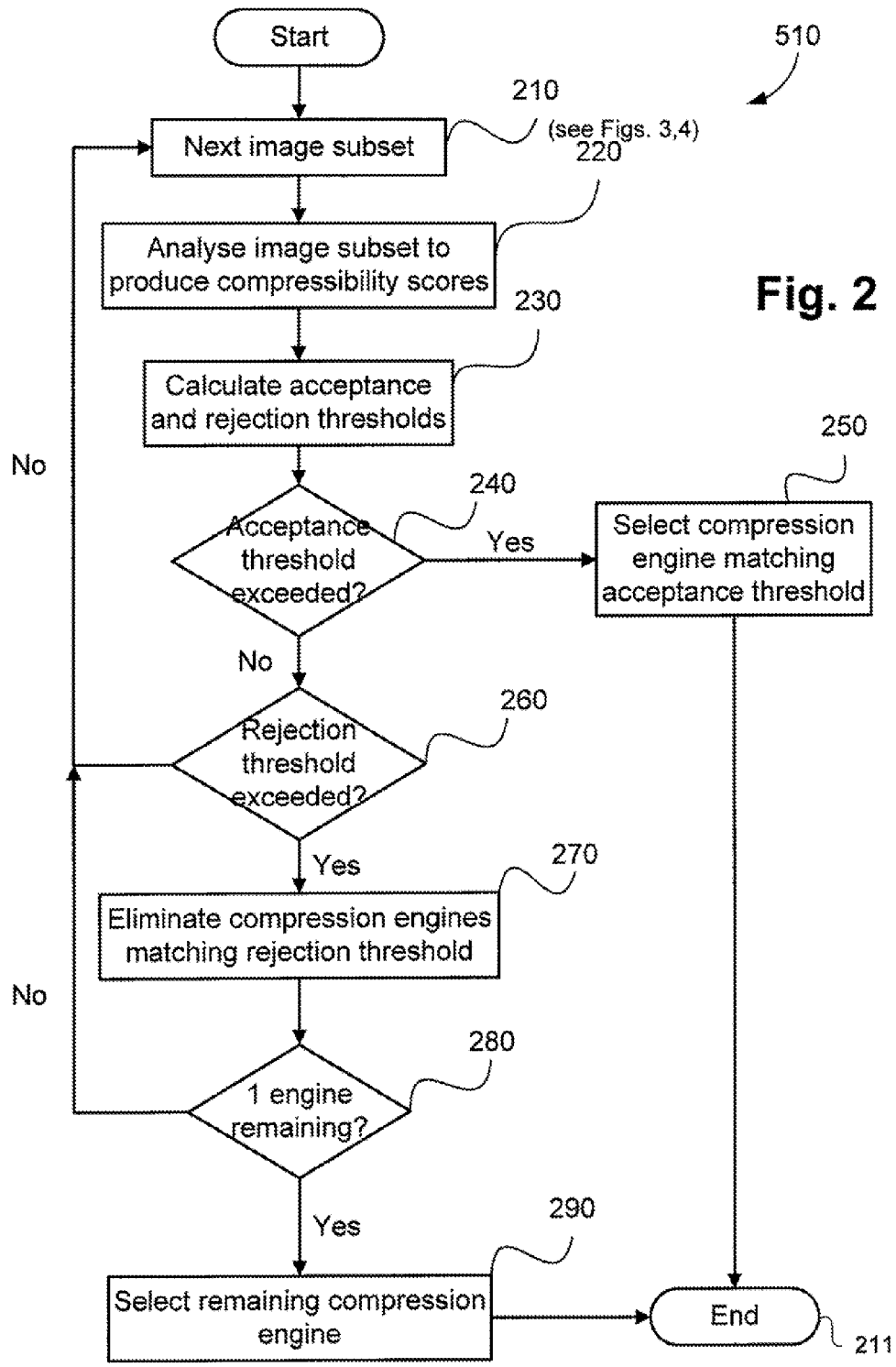
FIG. 2 is a flow diagram depicting the process performed by the image analyser of FIG. 5 for selecting between methods of compression of images according to one TBCS arrangement.

FIG. 2 is a flow diagram describing the process performed by the image analyser 510 (see FIG. 5) in a TBCS arrangement. The process steps in FIG. 2 are performed, in the present TBCM arrangement, by the processor 105 as directed by the TBCS software application 133 executing on the computer 101.

The image analyser process 510 starts by selecting, in a step 210, a "next image subset" from the image 1301 (see FIG. 12). The manner in which the image subsets are defined is described in the section entitled "Image analyser implementation details" below.

A following step 220 analyses this image subset. The analysis involves using the image data in the image subset to determine a "compressibility score" for the image subset in relation to one or more of the candidate compression methods 520, . . . , 530 being considered. The compressibility score relating to a given candidate compression method is determined by processing the image data in the image subset in accordance with the compressibility attribute 1303, . . . , 1305 associated with the corresponding compression method 520, . . . , 530 in question. As previously noted, compressibility attributes may be provided for each corresponding compression method, however this is not necessary, as long as compressibility attributes are provided for at least all but one corresponding compression method.

A "compressibility score" is determined for a portion of the image 1301, and represents, for a particular compression method 520, . . . , 530 an estimate of the compression ratio that would be achieved by using the compression engine in question to compress the image 1301. In this example, for the given input image 1301, one or more compressibility scores are thus determined. Each compressibility score represents the suitability of a corresponding compression method for compressing the image data in the image 1301. The determination of the compressibility score in the step 220 is explained in more detail in the section below entitled "Image analyser implementation details" with further reference to FIG. 2.

It is noted that in the present TBCS example, the described process 510 determines compressibility scores for all the available compression methods in the step 220. Other arrangements, such as determining compressibility scores for all but one of the available compression methods, may be used.

After a subset of the image data is analysed and one or more compressibility scores are determined, the analyser determines, in a step 230, at least one threshold pair for each compressibility score using the image data in the image data subset and the threshold description 1307 (see FIG. 12). A "threshold pair" defines a boundary for a particular compressibility score. Each threshold pair is made up of two independent thresholds namely an acceptance threshold and a rejection threshold. Both thresholds apply to a single compressibility score.

After threshold pairs have been determined for each compressibility score (ie for each compression method being considered), the process 510 proceeds to an acceptance threshold comparison step 240. At this step the compressibility score that has been determined in the step 220 for each candidate compression method is compared to the corresponding acceptance threshold that has been determined in the threshold determination step 230. If a compressibility score for a particular compression method is higher than or equal to the corresponding acceptance threshold, then the analyser process 510 follows a YES arrow from the step 240 and proceeds to an engine accepting step 250 which accepts (ie selects) the compression engine associated with the compressibility score as being a suitable compression engine for the given image 1301. Thus for example, considering the threshold example 300 depicted in FIG. 3 if a compressibility score falls in the "accepted" area 311, then the associated compression engine will be accepted as a suitable compression engine for the image 1301.

The process 510 is then directed from the accepting step 250 to a termination step 211, the process 510 is stopped, and the compression engine selected by the step 250 on the basis of the compressibility score is selected to compress the image 1301.

If none of the acceptance thresholds are reached, ie if none of the compressibility scores associated with the candidate compression engines (ie 1014, . . . , 1017 in FIG. 9 or equivalently 520, 530 in FIG. 5) meet the corresponding acceptance threshold criteria, then the analyser process 510 follows a NO arrow from the decision step 240 and proceeds to a rejection threshold comparison step 260. At this comparison step 260 each compressibility score is compared to the corresponding rejection threshold determined in the threshold determination step 230. If any of the compressibility scores do not meet (eg are lower than) their corresponding rejection thresholds, the analyser process 510 follows a YES arrow from the step 260 and proceeds to an engine elimination step 270 which rejects (ie eliminates) the compression engines associated with compressibility scores that did not meet the corresponding rejection threshold criteria as being unsuitable. Thus for example, considering the threshold example depicted in FIG. 3, if a compressibility score falls in the "rejected" area 312, then the associated compression engine will be rejected and eliminated by the elimination step 270.

If a candidate compression engine is rejected in the elimination step 270, the compressibility score and thresholds associated with the rejected compression engine are excluded from any further analysis steps. The compressibility score and thresholds associated with the rejected compression engine are thus not determined and the compressibility score is not compared to any thresholds in further analysis steps.

After all the candidate compression engines failing the rejection threshold test in the step 260 have been eliminated by the elimination step 270, the process 510 is directed to a decision step 280 which determines the number of compression engines which have not been eliminated. Thus for example, considering the threshold example depicted in FIG. 3 if a compressibility score falls in the "undecided" area 313, then the associated compression engine will not be accepted as a suitable compression engine for the image 1001 but will not be rejected either.

Figure 3:
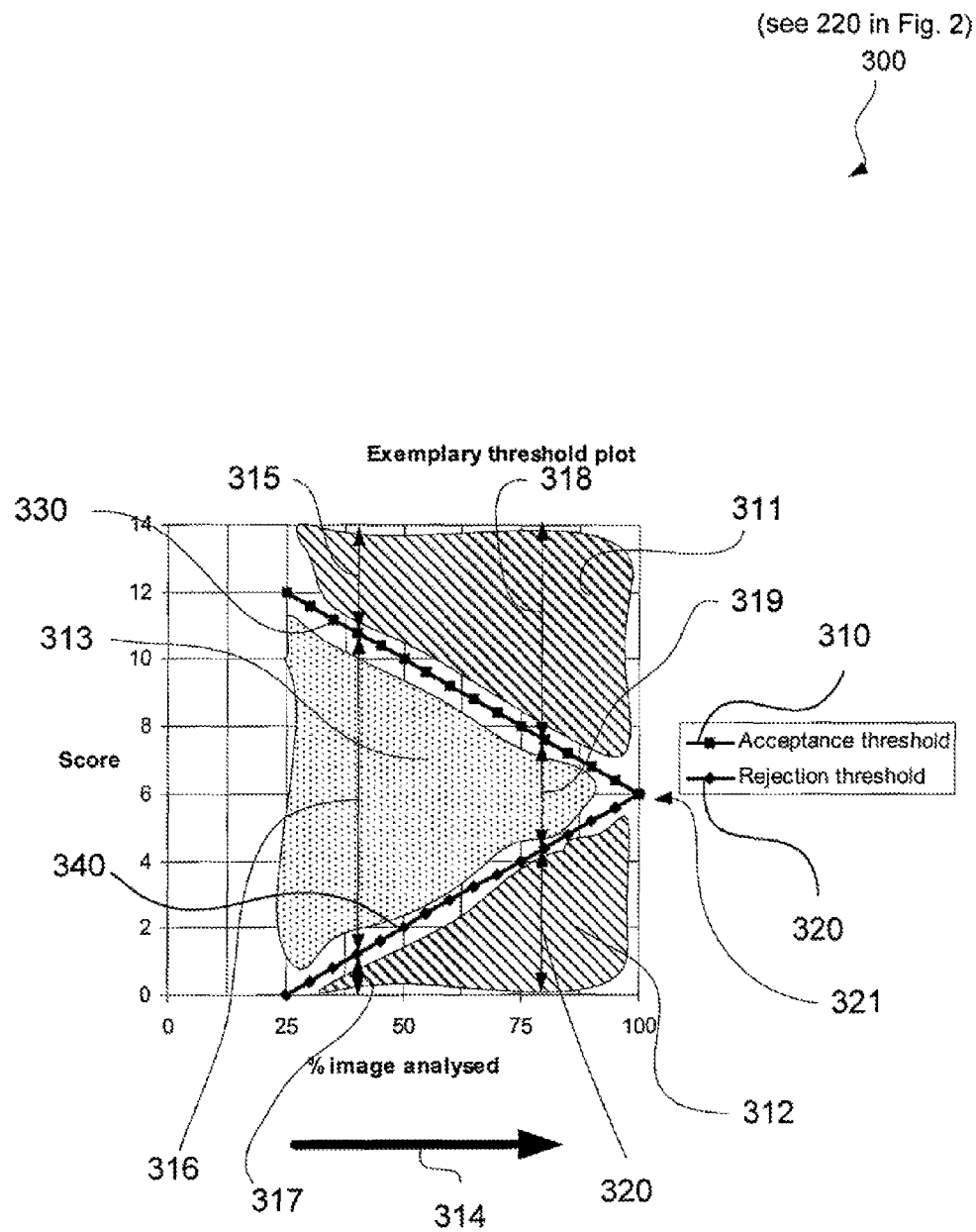
FIG. 3 is a plot of analysis thresholds used in an exemplary image analysis process of FIG. 2.

If there is only one compression engine remaining that has not been eliminated (ie an engine whose compressibility score lies in the area 313 in FIG. 3, or where an engine has no associated compressibility score), then that remaining compression engine is presumed to be better than all of the alternative candidates, and the analyser process 510 follows a YES arrow from the step 280 and proceeds to a remaining engine acceptance step 290, where the remaining compression engine is selected for compression of the image 1301. The process 510 is directed to the END step 211 and the analysis is stopped at this step.

Returning to the step 280, if no acceptance threshold criterion has been met and there remain at least two compression engines that have not been eliminated (noting that a compression engine may be in the "not eliminated" state without having any associated compressibility score), the analyser process 510 follows a NO arrow from the step 280 and the process 510 returns to the step 210 which selects a next subset of the image data for analysis. It is noted that in one TBCS arrangement, where all but one compression engine has a compressibility score, the engine without a compressibility score may be selected if all other engines are rejected.

This further subset of image data is then analysed in the same manner as above in the subsequent subset analysis step 220, and each compressibility score from the previous analysis step is adjusted to take into account the new analysis results. It is noted from FIG. 3 that as further subsets of the image are successively processed, the process 510 in FIG. 2 progresses in a direction depicted by an arrow 314 in FIG. 3, with consequent change in the acceptance and rejection threshold curves 330 and 340 respectively. That is, the calculation of threshold values depends on the proportion of the total image that has previously been analysed. In particular, with reference to FIG. 3, the acceptance threshold for using a compression method follows a downward sloping line as a higher proportion of image is analysed. In other words, this threshold becomes easier to cross as the percentage of image analysed increases. For example, after twenty five percent (25%) of the image is analysed, the compressibility score should be twelve (12) before the compression method associated with the acceptance threshold is used. However, when seventy five (75%) of the image is analysed, the compressibility score need only be eight (8) before the compression method is accepted for use. After the compressibility scores are adjusted, they are again tested against acceptance and rejection thresholds. These thresholds are adjusted before the testing step. It is noted, considering the repeated successive processing loops of the process 510, that since both the compressibility scores and the threshold pairs are dependent upon processing of further image subsets, that both the compressibility scores and the threshold pair values change with each successive processing loop as depicted by the arrow 314.

On the other hand, the rejection threshold to remove a compression method from a list of candidate compression method follows an upward sloping line in the TBCS arrangements as shown in FIG. 3. Again with reference to FIG. 3, the rejection threshold follows an upward sloping line as a higher proportion of image is analysed. In other words, this threshold becomes easier to cross as the percentage of image analysed increases. For example, after twenty five percent (25%) of the image is analysed, the compressibility score should be zero (0) before the compression method associated with the rejection threshold is rejected. However, when seventy five (75%) of the image is analysed, the compressibility score need only be four (4) before the compression method is rejected for use.

However, it should be noted that the shapes of the threshold plot as shown in FIG. 3 are merely examples of possible threshold plots. Other shapes of the threshold plots may be used in the TBCS arrangements. One possible TBCS arrangement has a V-shaped acceptance threshold plot, with the trough at, say, 50% of the image analysed on the x-axis. Such a threshold plot means that when the percentage of image analysed is less than 50%, the threshold plot follows a downward sloping direction and thus will allow the acceptance threshold to be crossed more easily as a higher proportion of image is analysed. On the other hand, when the percentage of the image analysed is more than 50%, the threshold plot follows an upward sloping direction, making it harder for the system to choose this compression method, possibly because there is another candidate compression method that is more suited for this image.

In one example, the thresholds may be set to unattainable values to force a minimum amount of image data to be processed (ie forcing a minimum number of iterations of the process 510 to be performed) before any threshold can be crossed. This ensures that image processing does not cease prematurely before an accurate estimate of the suitability of a compression engine can be obtained, as depicted in the example in FIG. 3 where thresholds are only defined once at least 25% of the image in question has been processed.

This approach may be used to ensure a minimum level of confidence that a representative amount of the image is considered when selecting a compression method. For example, if only 10% of the image data has been examined it might be possible for the remaining 90% of image data to have significantly different characteristics to the first 10%, such that a significantly different compressibility score would be determined for the whole image.

As more of the image data is analysed with successive performance of the step 210 and the subsequent processing steps in the process 510 (depicted by an arrow 314), confidence increases that the image data examined so far is representative of the whole image 1301.

The thresholds determined in the threshold determination step 230 thus allow a potentially large amount of error in the determined compressibility scores at an early stage of analysis. This potentially large amount of error is depicted by the relatively large size of an arrow 316 (depicting an "undecided" state) when compared to the relatively small sizes of arrows 315 and 317 (which respectively depict "accepted" and "rejected" states). If a compression engine is to be accepted at this stage of the analysis, the compressibility score representing that engine should overwhelmingly indicate that the compression method is suitable.

The scenario depicted in FIG. 3, namely that the analyser may not determine the thresholds (or compare the compressibility score to the thresholds) until a certain percentage of the image data has been analysed (e.g., 25%), is the method described in the exemplary TBCS arrangement described in the "Image analyser implementation details" section below.

As more image data is examined, the likely error in the compressibility scores due to the image data not yet examined reduces. The acceptance and rejection thresholds may therefore be set more aggressively (ie less conservatively). See for example the reduction in the size of an "undecided" arrow 319 relative to an "accepted" arrow 318 and a "rejected" arrow 320.

Typically the thresholds 330, 340 are adjusted linearly as the amount of data analysed increases in the direction 314. However, there are no restrictions on the form of the threshold adjustment that may be performed. The manner in which thresholds are adjusted is defined by the threshold description 1307 in FIG. 12.

Figure 6:
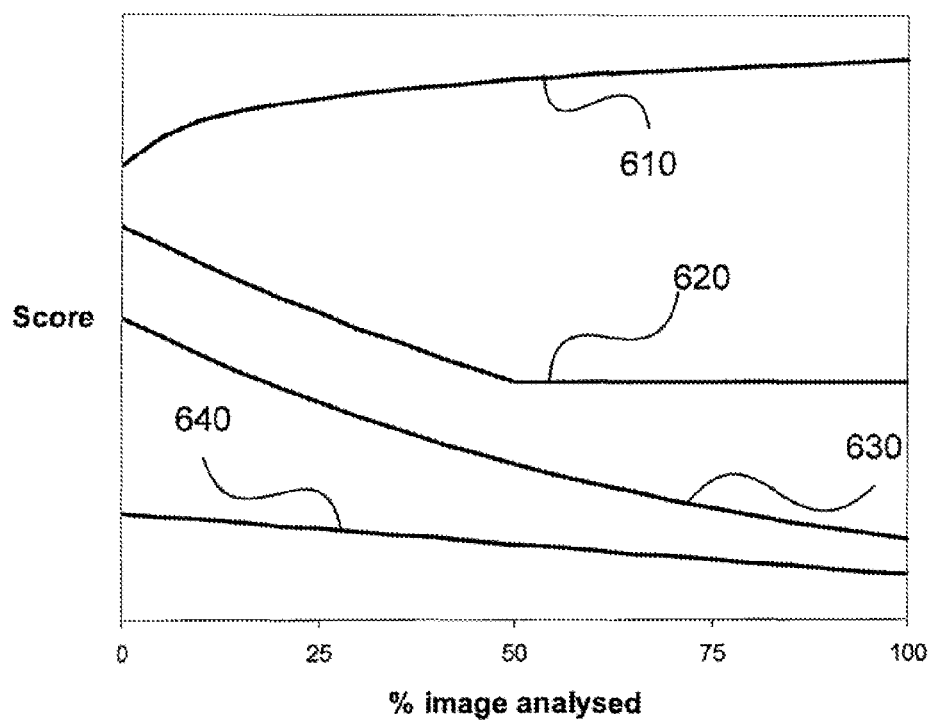
FIG. 6 is a plot of the types of thresholds that may be used during image analysis.

FIG. 6 shows plots of the types of thresholds that may be used during the image analysis process 510. As more of the image 1301 is analysed (by performing more iterations of the process 510), thresholds may be adjusted linearly as depicted by 640, or may be adjusted by evaluating a more complex function of the proportion of data analysed. The examples shown in FIG. 6 include an exponential curve 630, a logarithmic curve 610, or a combination of functions 620. The curve 620 represents an exponential curve when 0-49% of the image has been analysed and a constant threshold when the image is in the range of 50-100% analysed.

The optimal threshold to use depends on the method used to determine the compressibility score against which the threshold is compared. The method used to determine compressibility scores are defined by the corresponding compressibility attributes 1303, . . . , 1305 in FIG. 12.

By adjusting thresholds appropriately as the image is analysed, the image analyser 510 accounts for the change in the uncertainty of the compressibility scores as analysis progresses. This allows the image analyser process 510 to reliably accept or reject a compression engine before all of the image data from the particular image 1301 has been analysed. In this way the image analyser process 510 only examines enough of the image data as is necessary to confirm the suitability of one or more compression engines with a desired degree of confidence. This analysis method has the advantage of reducing the execution time needed to select a compression method for an image while maintaining a desired level of confidence in the compression method selection result. The following sections describe TBCS arrangements in greater detail.

Image Analyser Implementation Details

An exemplary TBCS arrangement will now be described in more detail with reference to FIGS. 2 and 5.

As noted previously, the compressor module 960 in the present TBCS example contains two compression engines, namely a Packbits compression engine 520 and a JPEG compression engine 530. The image analyser 510 selects one of these two compression engines for compression of the image 1301.

The image analyser 510 begins by selecting in the step 210 in FIG. 2 the next image subset 210 to read from the image. In this TBCS arrangement example, each image subset consists of one scan line of the image 1301. However, in general the image subset chosen in the step 210 may be any subset of image pixels in the image 1301. For example, an image subset may be a subset of one or more pixels from a single scan line, a strip of more than one scan line, or a rectangular tile with width and height less than the entire image. Furthermore, each image subset may contain a different number of pixels from the image.

In this TBCS arrangement example, the image analyser starts with the first scan line in the image 1301, and the next image subset is always the next consecutive scan line in the image 1301 yet to be analysed. However, in general, there is no restriction on the order in which scan lines or other image subsets can be analysed. For example, in analysing a 10-scan line image, the image analyser may start at the first scan line, having an index 0, and choose every second scan line as each next image subset. In this case the order of analysis would be scan line indices 0, 2, 4, 6, 8, 1, 3, 5, 7, 9. Further, the scan line chosen to start image analysis need not be the first scan line in the image, and analysis may start at any scan line.

Once the scan line (ie the image subset) has been chosen, it is then analysed in the subset analysis step 220 to determine a compressibility score. In this TBCS arrangement example, a single compressibility score is determined to represent the suitability of compressing the image data with the Packbits compression engine. In other words, a compressibility attribute such as 1303 is provided for one of the compression engines in FIG. 5 (namely the Packbits compression engine 520), but not for the other compression engine 530. Accordingly, a compressibility score is determined only for the Packbits compression engine 520 but not for the other compression engine 530. The determination of the compressibility score is described in more detail below with reference to FIG. 4.

Returning to FIG. 2, to determine what action to take based on the compressibility score, the threshold determination step 230 determines one acceptance and one rejection threshold. The acceptance threshold, which is based upon the threshold description 1307, is the minimum compressibility score required for the Packbits compression engine to be selected. The rejection threshold is the maximum compressibility score required for the Packbits compression engine to be rejected as a suitable compression engine. These thresholds are a function of the proportion of the entire image 1301 that has been examined.

In this TBCS arrangement example a target Packbits compression ratio of 6 is specified. This is depicted by a point 321 in FIG. 3. That is, the Packbits compression engine is the preferred engine to use if a target compression ratio of 6 or greater can be attained. If the Packbits compression engine cannot attain a compression ratio of 6 or greater, the JPEG compression engine is the preferred engine. The value of the target compression ratio forms the basis for determining the acceptance and rejection thresholds by the step 230 during image analysis. Accordingly, in this example the target compression ratio forms part of the threshold description 1307 in FIG. 12. The determination of the acceptance and rejection thresholds by the step 230 is described in more detail below with reference to FIG. 3.

Returning to FIG. 3, it is noted that in this TBCS arrangement, while only 0-25% of the image 1301 has been analysed, the thresholds are not determined and the compressibility scores are not compared to any thresholds. This ensures that at least 25% of the image 1301 is analysed before any compression engines are evaluated. As described above, this is done so that image analysis does not cease prematurely before an accurate estimate of the suitability of the compression engine can be obtained.

After the acceptance threshold and the rejection threshold have been determined by the step 230, the compressibility score (determined by the step 220) is tested against each threshold. Accordingly, in the following acceptance threshold comparison step 240, the compressibility score is compared with the acceptance threshold. If the compressibility score is greater than the acceptance threshold, the method proceeds to the engine accepting step 250. The engine accepting step 250 selects the Packbits compression engine and analysis ends. If the compressibility score does not exceed the acceptance threshold, the method proceeds to the rejection threshold comparison step 260 where the compressibility score is tested against the rejection threshold. If the compressibility score is less than the rejection threshold, the method proceeds to the engine elimination step 270. At the engine elimination step 270, the Packbits compression engine is rejected and the analyser proceeds to the engine remaining decision step 280 where it determines whether analysis should continue. Analysis will only continue if there is more than one compression engine remaining. The analyser in the exemplary TBCS arrangement contains two compression engines, so if the Packbits compression engine is rejected in the engine elimination step 270, there is only one compression engine remaining. Thus the method will proceed to the remaining engine selection step 290 where it selects the JPEG compression engine and analysis ends.

If at the rejection threshold comparison step 260 it is determined that the rejection threshold was not satisfied, the method proceeds back to the image subset selection step 210. Likewise, if no acceptance threshold is exceeded and there remain at least two compression engines that have not been rejected, analysis proceeds back to the image subset selection step 210. At the image subset selection step 210, the next scan line is selected. The next scan line is analysed at the subset analysis step 220 to produce an updated compressibility score. This compressibility score, whose manner of determination is specified in the associated compressibility attribute depicted in FIG. 12, may take into account the analysis results of all previously analysed scan lines.

The acceptance and rejection thresholds are redetermined in the threshold determination step 230. As described in detail above, as more of the image has been analysed, the thresholds will be set more aggressively (ie progressing from the illustrative arrows 315, 316, 317 to the illustrative arrows 318, 319, 320) compared to the analysis of the previous scan line. That is, the acceptance threshold 330 is lowered and the rejection threshold 340 is raised.

The analyser process 510 continues to loop through the acceptance threshold comparison step 240, the rejection threshold comparison step 260, the image subset selection step 210, the subset analysis step 220 and the threshold determination step 230 until either an acceptance threshold or a rejection threshold for the Packbits compressibility score is exceeded or satisfied. At that point the appropriate compression engine is selected as in either the remaining engine selection step 290 or the engine accepting step 270 and analysis ends.

If the compressibility score representative of the analysed subset exceeds neither of the acceptance or the rejection thresholds, the analyser process 510 loops through until the whole image 1301 is analysed. If, after the whole image is analysed, the compressibility score does not satisfy the acceptance or rejection threshold values, a fallback compression method may be used to compress the image. The fallback compression method may be, in the exemplary TBCS arrangement, the Packbits compression method or the JPEG compression method, or any other compression methods, even though the compression method does not have a threshold value associated with it for selection using the process described in the current TBCS arrangement. Alternatively, the image may be output without compression if a suitable compression method cannot be found.

In an alternate TBCS arrangement, if there are multiple compression methods from which to choose to compress an image, the analyser process 510 loops through the acceptance threshold comparison step 240, the rejection threshold comparison step 260, the image subset selection step 210, the subset analysis step 220 and the threshold determination step 230. If the subset analysis step 220 produces a compressibility score representative of the subset that exceeds an acceptance threshold, the compression method, JPEG compression method for example, associated with the acceptance threshold is used to compress the image. On the other hand, if the compressibility score satisfies a rejection threshold associated with the JPEG compression method, the JPEG compression method is removed from the list of multiple compression methods that can be used to compress the image.

Compressibility Score Calculation

Figure 4:
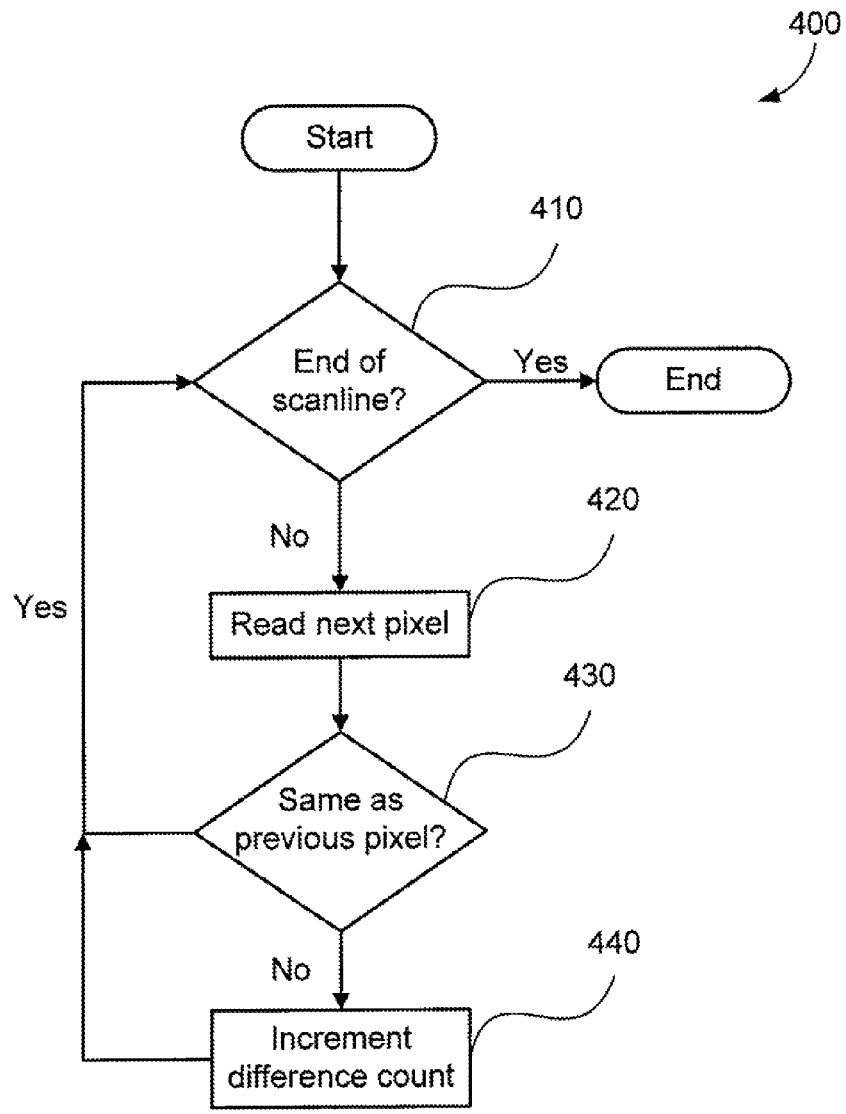
FIG. 4 is a schematic flow diagram illustrating a method of analysing the compressibility of a scan line.

FIG. 4 is a schematic flow diagram illustrating a scan line analysis method 400 of analysing the compressibility of a scan line in the exemplary TBCS arrangement in order to determine a compressibility score. This is an example of the method used in the scan line analysis step 220 in the exemplary TBCS arrangement. The method 400 is defined by the associated compressibility attribute in FIG. 12.

This scan line analysis method 400 analyses each pixel in the scan line sequentially and counts the number of colour changes across the scan line.

The process 400 of FIG. 4 makes use of a difference counter which accumulates the number of colour changes across all analysed scan lines in the image 1301. The initial value of the difference counter (before any image analysis begins) is one (1). The scan line analysis method 400 increments the difference counter when a colour change is encountered on a scan line. As the Packbits compression engine 520 relies on run-length encoding, this difference counter value approximates the size of the compressed image. The image analyser 510 also maintains a count of the number of image pixels that have been analysed from the image. This count, together with the difference counter, is used to determine the expected compression ratio that might be achieved if the image were compressed with the Packbits compression engine 520. The process 400 in FIG. 4 is thus an example of how a compressibility score may be determined for the Packbits compression engine 520, and this process 400 is defined by the associated compressibility attribute (1303, . . . , 1305) depicted in FIG. 12.

In the exemplary TBCS arrangement, the scanline analysis method 400 starts at the left-most pixel in the selected scan line of the image 1301. The method commences with an end of scan line test step 410, where a test is made to check if the end of the scan line has been reached, i.e., no pixels remain to be analysed. If the step 410 returns a logical FALSE, then the process 400 follows a NO arrow from the step 410 and the method 400 proceeds to a pixel reading step 420 which reads the value of the next adjacent pixel in the scan line.

The method 400 then proceeds to a pixel comparison step 430 at which the as-yet unanalysed "next adjacent" pixel is compared with the previous pixel. The previous pixel is the immediately adjacent pixel in the scan line read before the pixel read in the pixel reading step 420. As there is no previous pixel when the first pixel in the scan line is analysed, the first pixel in the scan line is compared to a pixel having all channels set to zero (0) in the pixel comparison step 430. For example, in the case of an 8-bit RGB image, the first pixel in the scan line is compared with a pixel having an 8-bit RGB value of (0,0,0). At the pixel comparison step 430, if the currently analysed pixel describes a colour that is different to the colour of the previous pixel the method follows a NO arrow from the step 430 and proceeds to an incrementing step 440. Otherwise, the method follows a YES arrow from the step 430 and proceeds to the end of scan line test 410.

For example, if the current pixel has an 8-bit RGB value of (10,20,30) and the previous pixel has an 8-bit RGB value of (10,20,30), the colours of the two pixels are identical and the method proceeds to the end of scan line test 410. If the current pixel has an 8-bit RGB value of (10,20,30) and the previous pixel has an 8-bit RGB value of (10,20,31), the colours of the two pixels are different and the method proceeds to the incrementing step 440.

At the incrementing step 440, the value of the difference counter is incremented by one if the step 430 determined that the colour of the current pixel differs from the colour of the previous pixel. Following the incrementing step 440 the method proceeds to the end of scan line test 410. If the end of scan line test 410 is negative, the process 400 follows the NO arrow from the step 410, a next pixel is read in the pixel reading step 420, and the method 400 continues as described above. If the end of scan line test 410 is positive, i.e., no pixels remain to be analysed, the process 400 follows a YES arrow from the step 410 and the method 400 terminates. It can be seen that the result of the method is that the difference counter is increased according to the number of colour changes in the scan line.

The expected compression ratio (ie the compressibility score) of the image with respect to the compression engine in question (ie the Packbits engine 520 in this example) is the ratio of the number of pixels analysed to the difference counter value. For example, if the number of pixels analysed is 20 and the difference counter value is 5, the expected compression ratio is 20 divided by 5. Hence the expected compression ratio in this case is 4. This expected compression ratio is used to determine if the Packbits compression engine is suitable for the portion of the image analysed so far. The higher the expected compression ratio, the more suited the Packbits compression engine is to the currently-analysed image. This expected compression ratio is the compressibility score representing the suitability of the Packbits compression engine. This is the only compressibility score used in this example of the TBCS arrangement. This compressibility score is compared to acceptance and rejection thresholds to evaluate the suitability of the compression engine as described previously with reference to FIG. 2. The determination of these thresholds is now explained in detail below with reference to FIG. 3.

Threshold Calculation

FIG. 3 is a plot of the acceptance and rejection thresholds used during image analysis in the exemplary TBCS arrangement. These thresholds are defined by the threshold description 1307 in FIG. 12.

The plot in FIG. 3 sets upper and lower boundaries for acceptable compressibility score versus the proportion of the image 1301 that has been analysed. The upper line is the acceptance threshold 330. The lower line is the rejection threshold 340. Both thresholds converge at the target compression ratio of 6 when the whole of the image has been analysed.

In this TBCS arrangement the thresholds are not determined and the compressibility scores are not compared to any thresholds while less than 25% of the image has been analysed. However, in general, the choice of when to start threshold comparison may vary depending on how the compressibility score is determined. Also, considering an image analyser with multiple compressibility scores, the thresholds associated with each compressibility score may begin comparison at different percentages of the image 1301 analysed. For example, the acceptance and rejection thresholds of a compressibility score a may begin comparison at 10% while acceptance and rejection thresholds of a compressibility score b within the same analyser may begin comparison at 40%. It may also be desirable for the acceptance and rejection thresholds for a single compressibility score to take effect at different percentages analysed.

Also note that in this TBCS arrangement, a higher compressibility score means the corresponding compression engine is more suitable. Hence the acceptance threshold is an upper threshold that represents a minimum value of compressibility score required for acceptance of the associated compression engine. The acceptance threshold is satisfied when the compressibility score becomes greater than or equal to the acceptance threshold. Likewise, the rejection threshold is a lower threshold that represents the maximum value required for rejection. The rejection threshold is satisfied when the compressibility score becomes less than the rejection threshold.

Referring again to FIG. 3, both thresholds in this TBCS arrangement are adjusted linearly in the range 25-100% analysed. The values of the threshold in this range are controlled by four variables:

A: the percentage of the image analysed so far;

$T_{target}$: the target threshold at 100% analysed (that is, a compression ratio of 6);

C: the percentage of the image analysed before threshold comparison begins (that is, 25%); and $T_{min}$: the desired value of the rejection threshold when comparison begins (that is, 0).

The acceptance threshold ($T_{acceptance}$) which is depicted by the reference numeral 330 is then given by:

$$T_{acceptance}=T_{target}+(100-A)*(T_{target}-T_{min})/(100-C)$$

The rejection threshold ($T_{rejection}$) which is depicted by the reference numeral 340 is given by:

$$T_{rejection}=T_{target}-(100-A)*(T_{target}-T_{min})/(100-C)$$

For example, the acceptance and rejection thresholds when 50% of the image has been analysed are determined as follows (i.e., substituting A=50, $T_{target}$=6, C=25, $T_{min}$=0):

$$T_{acceptance}=6+(100-50)*(6-0)/(100-25)=10$$

$$T_{rejection}=6-(100-50)*(6-0)/(100-25)=2$$

These values can be verified by referencing FIG. 3 at 50% on the horizontal axis (% image analysed). The acceptance threshold ($T_{acceptance}$) at 50% 330 is 10. The rejection threshold ($T_{rejection}$) at 50% 340 is 2.

Although both thresholds in this TBCS arrangement are determined using a similar formula, it should be noted that each threshold may be adjusted independently if necessary. For example, a rejection threshold ($T_{rejection}$) could instead be determined using the formula:

$$T_{rejection}=T_{target}-(T_{target}/(100-C))*(100-A)*(100-A)/100$$

Figure 7:
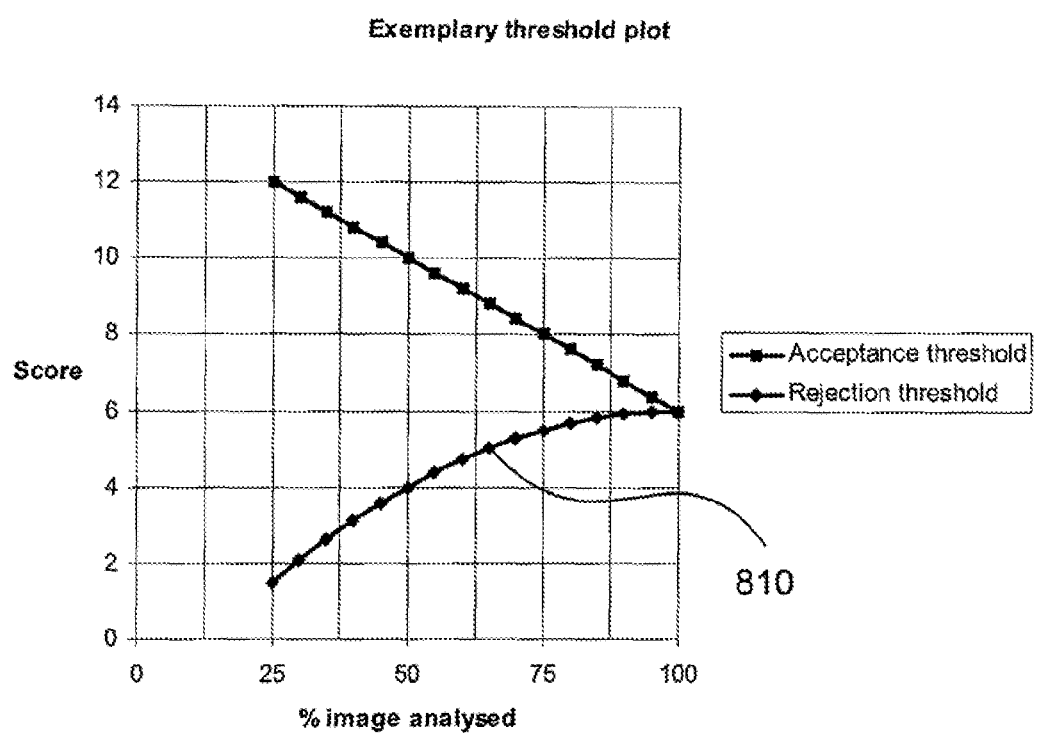
FIG. 7 is a plot of analysis thresholds determined using an alternative method.

FIG. 7 plots the resulting threshold using the original acceptance threshold and the substituted rejection threshold. In this case both the acceptance threshold and the rejection threshold 810 are adjusted independently.

Figure 10:
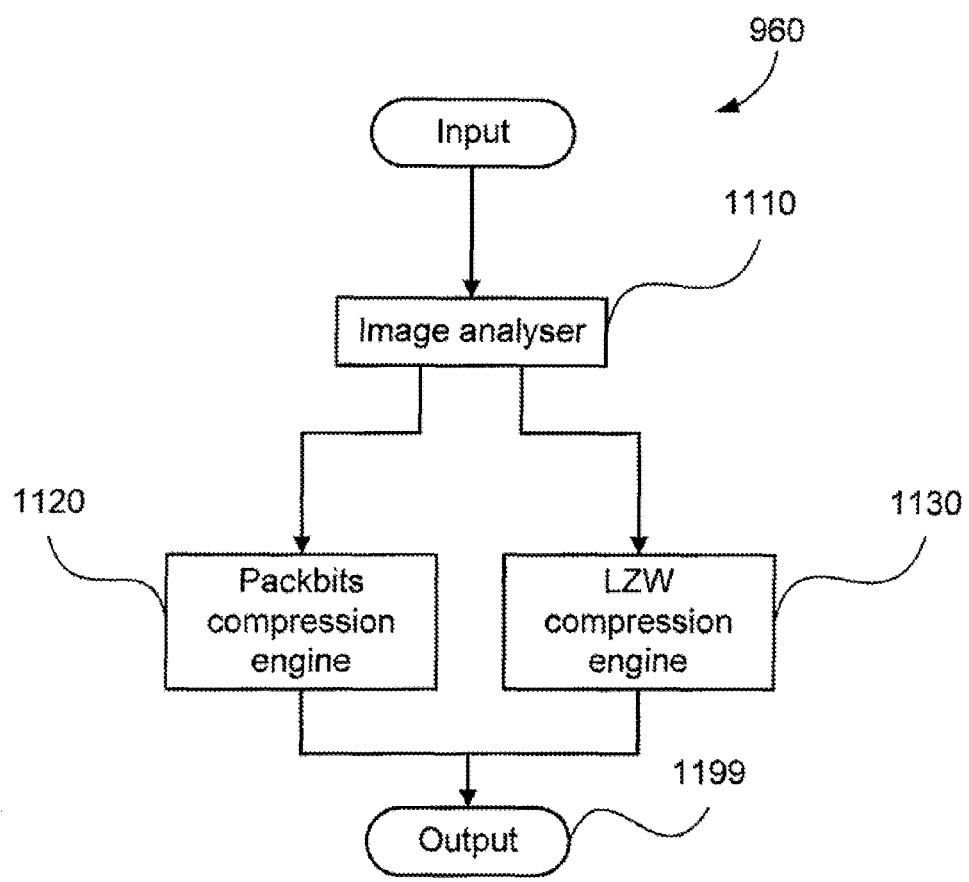
FIG. 10 is a schematic block diagram of a compressor module according to a TBCS arrangement.

Alternative TBCS Arrangement Using Multiple Compressibility Scores
Image Analyser Implementation Details An exemplary TBCS arrangement will now be described with reference to FIGS. 10 and 13. In this TBCS arrangement, the compressor module 960 contains two compression engines, namely a Packbits compression engine 1120 and a Lempel-Ziv-Welch (LZW) universal lossless data compression engine 1130. Since the TBCS arrangements can be implemented in software, hardware or a mixture of both, the compression engines 1120 and 1130 may be equivalently referred to as compression engine processes or compression engine modules. Similar comments apply to other processes/modules in the description. The image analyser 1110 selects one of these two compression engines for compression of the image.

Figure 13:
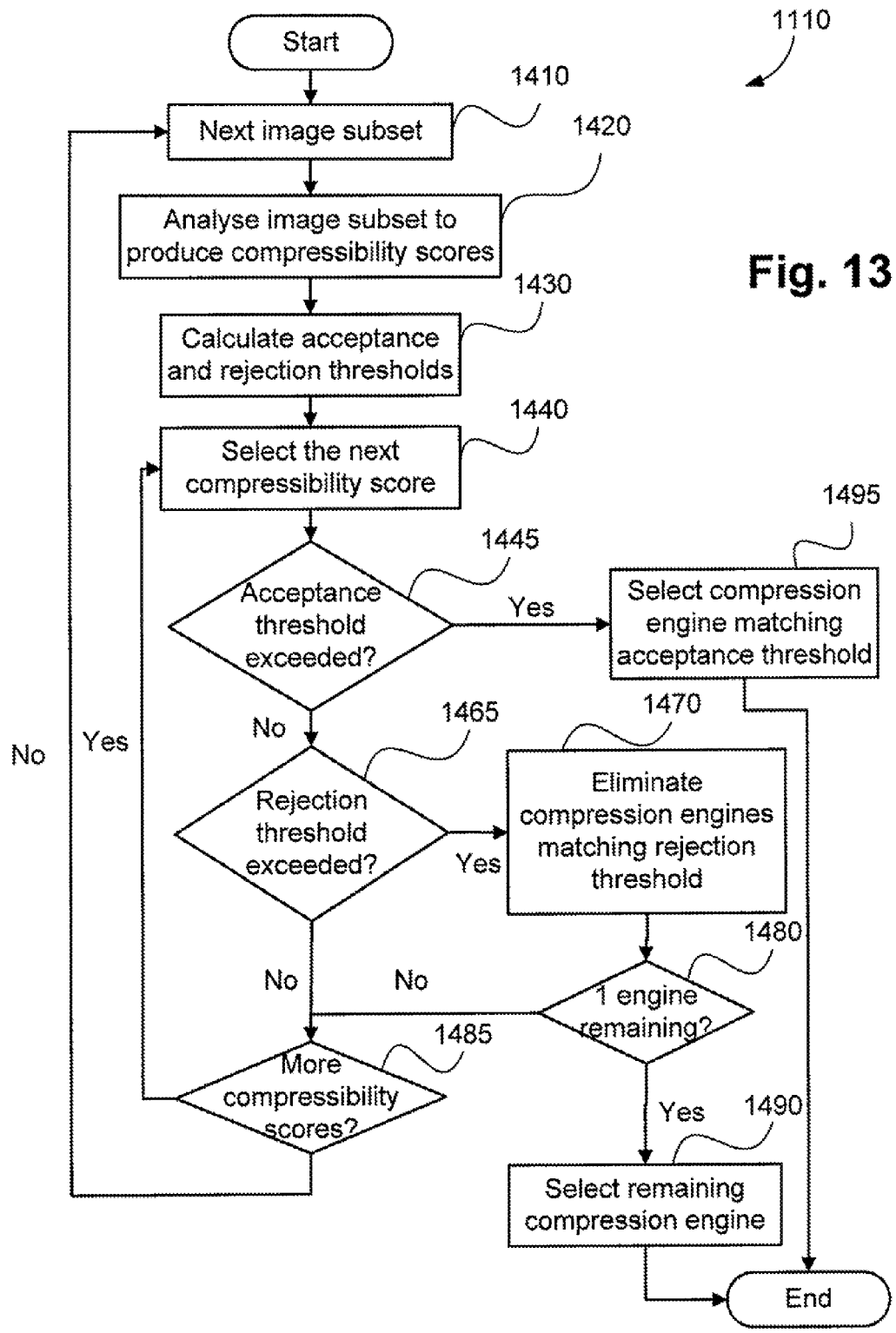
FIG. 13 is a flow diagram depicting the process performed by the image analyser of FIG. 10 for selecting between methods of compression of images according to one TBCS arrangement.

The image analyser 1110 begins by selecting, with reference to a step 1410 in the process 1110 in FIG. 13, the next image subset from the image.

In this example of the TBCS arrangement, each image subset consists of one scan line of the image. The image analyser starts with the first scan line in the image and the next image subset is the next consecutive scan line in the image yet to be analysed.

Once the scan line has been selected, it is then analysed in a subset analysis step 1420 to determine a number of compressibility scores. In this TBCS arrangement example, two compressibility scores are determined, namely a Packbits compressibility score to represent the suitability of compressing the image data with the Packbits compression engine, and an LZW compressibility score, to represent the suitability of compressing the image data with the LZW compression engine. The determination of the compressibility scores is described in more detail below.

To evaluate the determined compressibility scores, a threshold determination step 1430 determines a Packbits acceptance threshold, a Packbits rejection threshold, an LZW acceptance threshold and an LZW rejection threshold.

The Packbits acceptance threshold is the minimum compressibility score required for the Packbits compression engine to be selected. The Packbits rejection threshold is the maximum compressibility score required for the Packbits compression engine to be rejected as a suitable compression engine. These thresholds are determined based on the percentage of the entire image that has been examined.

The LZW acceptance threshold is the minimum compressibility score required for the LZW compression engine to be selected. The LZW rejection threshold is the maximum compressibility score required for the LZW compression engine to be rejected as a suitable compression engine. These thresholds are also determined based on the percentage of the entire image that has been examined.

In this TBCS arrangement a target Packbits compression ratio of 6 is used. That is, the Packbits compression engine is the preferred engine to use if a target compression ratio of 6 or greater can be attained. The value of the target Packbits compression ratio forms the basis for setting the Packbits acceptance and rejection thresholds during image analysis. The determination of the Packbits acceptance and rejection thresholds is described in more detail below with reference to FIG. 3.

In this TBCS arrangement example, a target LZW compression ratio of 3 is used. That is, if the Packbits compression engine cannot attain a compression ratio of 6 or greater, the LZW compression engine is the preferred engine to use if a target compression ratio of 3 or greater can be attained. The value of the target compression ratio forms the basis for setting the LZW acceptance and rejection thresholds during image analysis. The determination of the LZW acceptance and rejection thresholds is described in more detail below with reference to FIG. 11.

In this TBCS arrangement example, in the range of 0-25% analysed, the Packbits thresholds are not determined and the Packbits compressibility score is not compared to its associated thresholds as shown in FIG. 3. This ensures that at least 25% of the image is analysed before the Packbits compression engine is evaluated. This is done so that image analysis does not cease prematurely before an accurate estimate of the suitability of the Packbits compression engine can be obtained.

Figure 11:
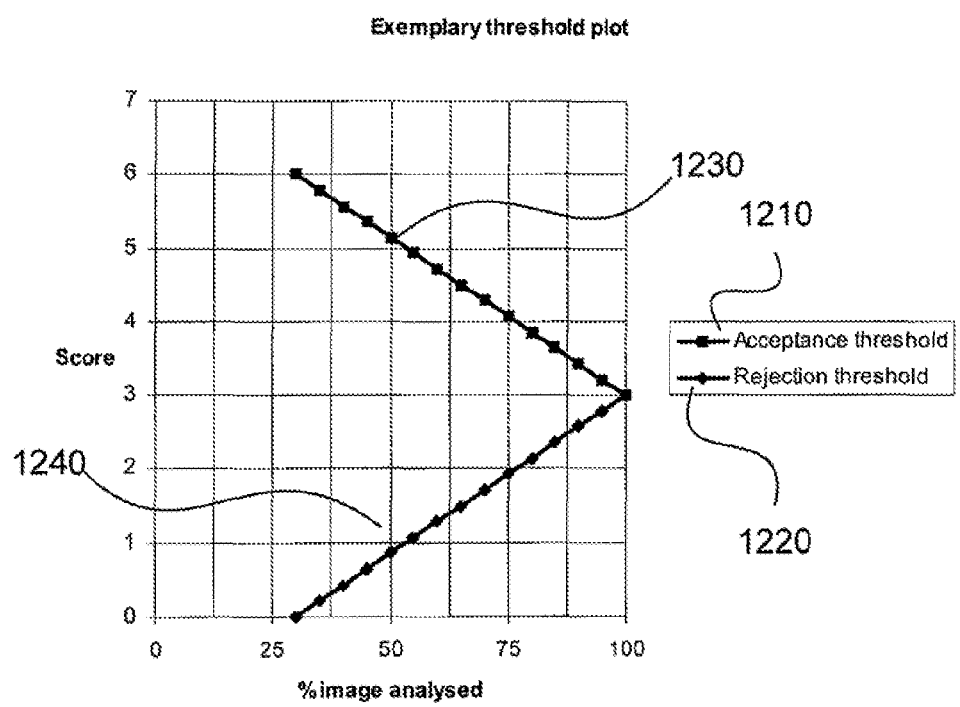
FIG. 11 is a plot of analysis thresholds used in an exemplary image analysis process.

In this TBCS arrangement example, in the range of 0-30% analysed, the LZW thresholds are not determined and the LZW compressibility score is not compared to its associated thresholds as shown in FIG. 11. This ensures that at least 30% of the image is analysed before the LZW compression engine is evaluated. This is done so that image analysis does not cease prematurely before an accurate estimate of the suitability of the LZW compression engine can be obtained.

After the acceptance thresholds and the rejection thresholds have been determined by the step 1430, each compressibility score is tested against its associated thresholds in a comparison loop 1440, 1445, 1465, 1470, 1480 and 1485. One of the compressibility scores determined in the step 1420, for example the Packbits compressibility score, is selected in the selecting step 1440. Then, in the acceptance threshold comparison step 1445, the selected Packbits compressibility score is compared with the Packbits acceptance threshold 310 as shown in FIG. 3. If the Packbits compressibility score is greater than its associated acceptance threshold, the method proceeds to an engine accepting step 1495. The engine accepting step 1495 selects the compression engine represented by the compressibility score that has exceeded the acceptance threshold and the analysis ends at an END step.

If the selected Packbits compressibility score is less than the associated Packbits acceptance threshold the method proceeds from the step 1445 to the rejection threshold comparison step 1465, where the Packbits compressibility score is compared to the Packbits rejection threshold 320 as shown in FIG. 3. If the Packbits compressibility score exceeds (ie is less than) the rejection threshold, then the Packbits compression engine is eliminated, in the elimination step 1470, as a candidate compression engine to compress the image. On the other hand, if the Packbits compressibility score does not exceed (ie is greater than) the rejection threshold 320, then the process 1110 continues to check if there are more compressibility scores that can be compared in the decision step 1485.

In this example, the LZW compressibility score is compared to the LZW acceptance threshold 1210 shown in FIG. 12. The method selects the LZW compressibility score in the step 1440 and compares the LZW compressibility score to the LZW acceptance threshold in the step 1445. If the LZW compressibility score is greater than its associated acceptance threshold, then the method proceeds from the step 1445 to the engine accepting step 1495. If not, the process 1110 proceeds from the step 1445 to the comparison step 1465 to determine if the LZW rejection threshold 1220 is exceeded. If the LZW compressibility score is less than (exceeds) its associated rejection threshold as determined in the comparison step 1465, the LZW compression engine represented by that compressibility score is rejected in the elimination step 1470.

The process 1110 then proceeds to the step 1480 to check if there is one compression engine remaining in the list of candidate engines. If the number of compression engines remaining becomes one (1) after rejecting an engine, the remaining compression engine is selected in a step 1490 to compress the image and analysis ends. If the number of compression engines remaining is greater than one, the image analyser continues the rejection threshold comparison process for the remaining engines.

Analysis continues if there is more than one compression engine remaining. The analyser in the exemplary TBCS arrangement contains two compression engines, so if either the Packbits or LZW compression engine is rejected in the engine elimination step 1470 there is only one compression engine remaining. Thus the method 1110 will proceed to the remaining engine selection step 1490 where the remaining compression engine is selected to compress the image and analysis ends.

If, after the rejection threshold comparison step 1465, it is determined that more than one compression engine remains, the method proceeds back to the decision step 1485. In this example, there are no more compressibility scores to compare, so the method 1110 continues with the image subset selection step 1410. At the image subset selection step 1410, the next scan line is selected. The next scan line is analysed at the subset analysis step 1420 to produce updated compressibility scores. These compressibility scores take into account the analysis results of all previously analysed scan lines.

The acceptance and rejection thresholds for each compressibility score are determined in the threshold determination step 1430. As described in detail above, as more of the image has been analysed, the thresholds will be set more aggressively compared to the analysis of the previous scan line. That is, the acceptance thresholds are lowered and the rejection thresholds are raised.

The analyser continues to loop through the threshold comparison loop 1440, 1445, 1465, 1470, 1480 and 1485, the image subset selection step 1410, the subset analysis step 1420, and the threshold determination step 1430 until one of the compressibility scores exceeds or satisfies its associated acceptance threshold or associated rejection threshold. At that point the appropriate compression engine is selected in either the remaining engine selection step 1490 or the engine accepting step 1495 and the analysis ends.

While none of the compressibility scores representative of the analysed subset exceeds its associated acceptance thresholds and at least two compression engines remain, the analyser loops through until the whole image is analysed. If, after the whole image is analysed, no compressibility score satisfies its associated acceptance value and at least two compression engines remain, a fallback compression method may be used to compress the image. The fallback compression method may, in the exemplary TBCS arrangement, be the Packbits compression method or the LZW compression method, or any other compression methods, even though the compression method does not have a threshold value associated with it for selection using the process described in the current TBCS arrangement example. Alternatively, the image may be output without compression if a suitable compression method cannot be found.

LZW Compressibility Score Calculation

Figure 9:
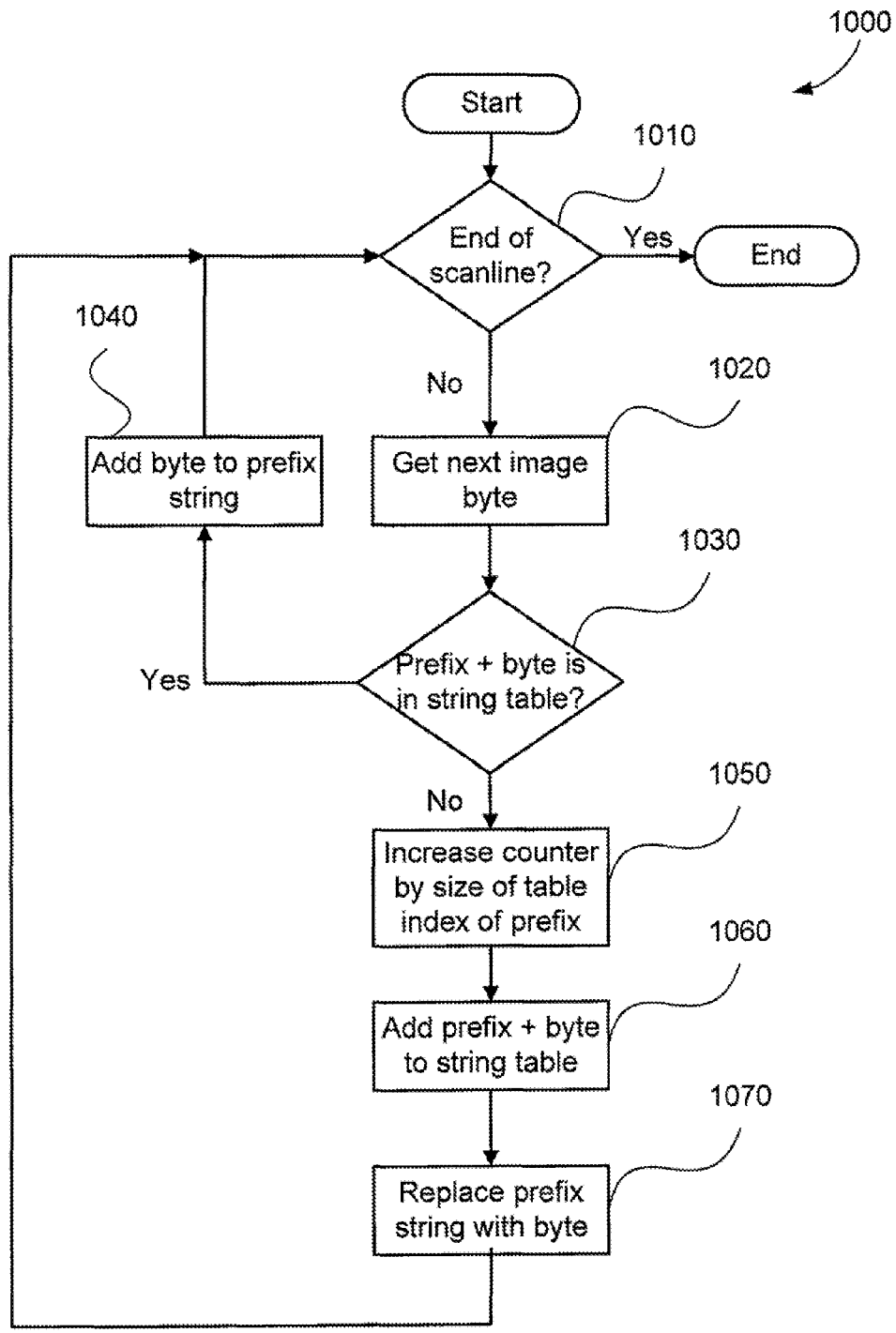
FIG. 9 is a schematic flow diagram illustrating a method of analysing the compressibility of a scan line.

FIG. 9 is a schematic flow diagram illustrating a scan line analysis method 1000 of analysing the compressibility of a scan line using the LZW compression engine in the exemplary TBCS arrangement. This is the method used in the scan line analysis step 1420 in the exemplary TBCS arrangement to determine a compressibility score for the LZW compression engine.

This scan line analysis method 1000 simulates the process of LZW compression to estimate the compressed size of the scan line in question. LZW compression is a dictionary-based compression method that builds a table of byte-patterns as the input data is processed. If a byte-pattern is read from the input data and already appears in the table, the table index of the byte-pattern (rather than the actual byte-pattern) is written as the output of the compression engine. If a byte-pattern does not appear in the table, it is written directly to output, assigned a table index and added to the table.

Before any image data is analysed, the table is initialised with an entry for each single-byte value possible from 0 to 255. Hence any single byte read from the input exists as an entry in the initialised table. Also before analysing any image data, a prefix string is initialised to the empty string. This prefix string is used to store characters encountered in the input.

Process 1000 of FIG. 9 makes use of a counter which accumulates the estimated number of bits that would be output from the simulated LZW compression. The initial value of the counter (before any image analysis begins) is, say, one (1). The scan line analysis method 1000 increases the counter when data would normally be output from the LZW compression. This accumulated counter value approximates the size of the LZW-compressed image. The image analyser 1110 also maintains a count of the number of image pixels that have been analysed from the image. This count, together with the counter, is used to determine the expected compression ratio that might be achieved if the image were compressed with the LZW compression engine 1130.

In the exemplary TBCS arrangement, the scanline analysis method 1000 starts at the left-most byte in the scan line. The scanline analysis method 1000 consumes bytes one at a time, for example, starting from the left-most byte in the scan line without regard to the number of bits used by each pixel. The method commences at an end of scan line test 1010, where a test is made to check if the end of the scan line has been reached, i.e., no bytes remain to be analysed. If the end of the scan line has been reached, the process 1000 follows a YES arrow from the step 1010 and the process ends. If not, the method proceeds from the step 1010 according to a NO arrow to a byte reading step 1020 where the next adjacent byte in the scan line is read.

The method then proceeds to a comparison step 1030 at which the string table is searched for the string formed by concatenating the prefix string and the unanalysed byte read in the byte reading step 1020. If the concatenated string is in the string table the method proceeds from the step 1030 along a YES arrow to a prefix extension step 1040, where the prefix string is replaced with the concatenated string before the method proceeds back to the end of scanline test 1010.

If in the comparison step 1030 the concatenated string is not in the string table, the method proceeds from the step 1030 along a NO arrow to a counter increasing step 1050. In the counter increasing step 1050, the counter is increased by the number of bits required to represent the index of the prefix string in the string table. The number of bits required is 12, as explained below.

In a real LZW compression, this index would be written to output and would form part of the compressed image data. As the purpose of this scanline analysis method in the TBCS example is to estimate the compressed size, no actual data is recorded in this step other than the number of bits required to represent this index. The size of the index depends on the maximum number of entries that are permitted in the table. In this TBCS arrangement the maximum number of entries in the table is chosen as 4096. Uniquely addressing the 4096 table entries requires 12 bits, so the size of the index in this TBCS arrangement is 12 bits.

The method then proceeds to a table addition step 1060 where the concatenated string used in the comparison step 1030 is added to the string table. The concatenated string is assigned the next available index in the string table and stored in the table. If the table size has already reached the maximum number of entries and no indexes are available, the table is initialised to its initial state and the concatenated string is not added to the string table. The initial state as described previously is to contain an entry for each single-byte value possible from 0 to 255.

The method then proceeds to a prefix replacement step 1070 where the prefix string is set to contain only the byte read in the byte reading step 1020. Following the prefix replacement step 1070, the method returns to the end of scanline test 1010. If the end of scan line test 1010 is negative, the next byte is read in the byte reading step 1020 and the method continues as described above. If the end of scanline test 1010 is positive, i.e., no bytes remain to be analysed, the method terminates.

The expected compression ratio of the image may be determined by comparing the counter value to the number of bytes analysed in the image so far. As the counter value is recorded as a number of bits, the counter value is first converted to a number of bytes by diving by eight. The expected compression ratio is then given by the ratio of the number of bytes analysed so far to the number of bytes in the counter value. For example, if the number of bytes analysed is 20 and the counter value represents 10 bytes, the expected compression ratio is 20 divided by 10. Hence the expected compression ratio in this case is 2. This expected compression ratio is used to determine if the LZW compression engine is suitable for the portion of the image analysed so far. The higher the expected compression ratio, the more suited the compression engine is to the currently-analysed image. This compression ratio is the compressibility score representing the suitability of the LZW compression engine. This compressibility score is compared to associated acceptance and rejection thresholds to evaluate the suitability of the compression engine as described previously with reference to FIG. 13. The determination of these thresholds is now explained in detail below with reference to FIG. 11.

LZW Threshold Calculation

FIG. 11 is a plot of the acceptance and rejection thresholds used during LZW image analysis in the exemplary TBCS arrangement. This is a plot of compressibility score versus the percentage of image analysed. The upper line is the acceptance threshold 1230. The lower line is the rejection threshold 1240. Both thresholds converge at the target compression ratio of 3 when the whole of the image has been analysed.

In this TBCS arrangement the thresholds are not determined and the compressibility scores are not compared to any thresholds while the image analysis is in the range of 0-30% analysed.

Referring again to FIG. 11, both thresholds in this TBCS arrangement are adjusted linearly in the range 30-100% analysed. The values of the threshold in this range are controlled by four variables:

A: the percentage of the image analysed so far;
$T_{target}$: the target threshold at 100% analysed (that is, 3);
C: the percentage of the image analysed before threshold comparison begins (that is, 30%);
$T_{min}$: the desired value of the rejection threshold when comparison begins (that is, 0).

The acceptance threshold ($T_{acceptance}$) is then given by:

$$T_{acceptance} = T_{target} + (100-A)^*(T_{target} - T_{min})/(100-C)$$

The rejection threshold ($T_{rejection}$) is given by:

$$T_{rejection} = T_{target} - (100-A)^*(T_{target} - T_{min})/(100-C)$$

For example, the acceptance and rejection thresholds when 50% of the image has been analysed are determined as follows (i.e., substituting A=50, $T_{target}$=3, C=30, $T_{min}$=0):

$$T_{acceptance}=3+(100-50)*(3-0)/(100-50)=5.143$$

$$T_{rejection}=3-(100-50)*(3-0)/(100-50)=0.857$$

These values can be verified by referencing FIG. 12 at 50% on the horizontal axis (% image analysed). The acceptance threshold ($T_{acceptance}$) at 50% 1230 is 5.143. The rejection threshold ($T_{rejection}$) at 50% 1240 is 0.857.

INDUSTRIAL APPLICABILITY

The arrangements described are applicable to the computer and data processing industries and particularly for the image processing industry.

The foregoing describes only some embodiments of the present invention, and modifications and/or changes can be made thereto without departing from the scope and spirit of the invention, the embodiments being illustrative and not restrictive.

I claim:

1. A computer implemented method of compressing an image using one of a plurality of compression methods, said method comprising the steps of:
    analysing a first portion of the image to determine a compressibility score for the whole of the image;
    comparing the compressibility score for the whole image to a plurality of thresholds, each of the plurality of thresholds being for a candidate compression method from the plurality of compression methods, wherein at least one of the plurality of thresholds is dependent upon an amount of a portion of the image which has been analysed;
    if the compressibility score for the whole image satisfies a first threshold of the plurality of thresholds, selecting the candidate compression method to compress the whole of the image;
    if the compressibility score for the whole image satisfies a second threshold of the plurality of thresholds, rejecting the candidate compression method; and
    if the compressibility score for the whole image satisfies none of the plurality of thresholds, analysing a second portion of the image to update the compressibility score for the whole image to thereby determine if one of the plurality of thresholds is satisfied.

2. A method according to claim 1, wherein if the compressibility score satisfies none of the plurality of thresholds, said method further comprising the steps of:
    adjusting at least one of the plurality of thresholds based on an amount of the first and second analysed portions of the image; and
    comparing a subsequent compressibility score to the plurality of adjusted thresholds to select a compression method.

3. A method according to claim 2, wherein said method is repeated until one of the following criteria is satisfied:
    the candidate compression method is selected either (i) based on the first threshold value or (ii) because the candidate compression method is the only compression method that has not been eliminated; or
    the entire image has been analysed, in which event the method comprises one of the following steps:
        compressing the image using a compression method selected from the plurality of compression methods; or
        outputting the image without compression.

4. A method according to claim 1, wherein the compressibility score is a number of colour changes across a scan line in the first portion of the image that is being processed to determine the compressibility score.

5. A computer implemented method of compressing an image, said method comprising the steps of:
    analysing a first portion of the image to determine a compressibility score for the whole of the image;
    determining an acceptance threshold and a rejection threshold according to an amount of the first portion of the image which has been analysed;
    comparing said compressibility score for the whole image with said acceptance threshold and with said rejection threshold;
    if said compressibility score for the whole image satisfies said acceptance threshold, selecting a first compression method for compressing the whole of the image;
    if said compressibility score for the whole image satisfies said rejection threshold, selecting a second compression method for compressing the whole of the image; and
    if the compressibility score for the whole image satisfies neither said acceptance threshold nor said rejection threshold, analysing a second portion of the image to update the compressibility score for the whole image, and updating said acceptance threshold and said rejection threshold based on the amount of the first and second portions of the image, to thereby determine if one of the plurality of thresholds is satisfied.

6. A method according to claim 5, wherein if said value satisfies neither the acceptance threshold nor the rejection threshold, said method comprising the further steps of:
    comparing the updated compressibility score to the updated acceptance threshold and the updated rejection threshold to select a compression method.

7. A method according to claim 6, wherein said method is repeated until at least one of the following criterion is satisfied:
    (A) a compression method is selected; and
    (B) the whole image has been analysed;
    wherein upon the whole image being analysed, performing at least one of the following steps:
        (B)(i) compressing the image using a compression method; and
        (B)(ii) outputting the image without compression.

8. A method according to claim 5 wherein the acceptance threshold decreases with an amount of an analysed portion of the image and the rejection threshold increases with an amount of an analysed portion of the image that has been processed.

9. An apparatus for compressing an image, said apparatus comprising:
    a processor; and
    a storage device storing a program for directing the processor to execute a method for compressing said image, the program comprising:
    code for a plurality of candidate compression modules
    code for processing a portion of the image to determine, for at least some of the candidate compression methods, associated compressibility scores for the whole image, corresponding acceptance thresholds and corresponding rejection thresholds, wherein the compressibility scores, and at least one of the acceptance thresholds and the corresponding rejection thresholds are dependent upon the proportion of the image that has been processed;

code for comparing the compressibility scores for the whole image to the acceptance thresholds and the rejection thresholds;

code for selecting, if a compressibility score for the whole image satisfies the corresponding acceptance threshold, the associated candidate compression method for compressing the whole image; and code for compressing the whole image using the selected candidate compression method.

10. A computer readable non-transitory storage medium storing a program for directing a processor to execute a method for compressing an image, the program comprising:

code for a plurality of candidate compression modules;

code for processing a portion of the image to determine, for at least some of the candidate compression methods, associated compressibility scores for the whole image, corresponding acceptance thresholds and corresponding rejection thresholds, wherein the compressibility scores, and at least one of the acceptance thresholds and the rejection thresholds are dependent upon the proportion of the image that has been processed;

code for comparing the compressibility scores for the whole image to the acceptance thresholds and the rejection thresholds;

code for selecting, if a compressibility score for the whole image satisfies the corresponding acceptance threshold, the associated candidate compression method for the whole image; and code for compressing the whole image using the selected candidate compression method.

11. A method according to claim 1, wherein the first threshold decreases with an amount of an analysed portion of the image and the rejection threshold increases with an amount of an analysed portion of the image.

12. A computer implemented method of compressing an image using one of a plurality of compression methods, said method comprising the steps of:

analysing a portion of the image to determine a compressibility score for the whole image;

comparing the compressibility score for the whole image to a threshold for a candidate compression method from the plurality of compression methods, the threshold decreasing with an amount of the analysed portion of the image;

if the compressibility score for the whole image satisfies a first threshold of the plurality of thresholds, selecting the candidate compression method to compress the whole of the image; and if the compressibility score for the whole image does not satisfy the threshold, increasing the amount of the analysed portion of image.

* * * * *